United States Patent
Lee et al.

(10) Patent No.: US 12,455,259 B2
(45) Date of Patent: Oct. 28, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Wei Lee, Hsinchu (TW); Chung-Liang Cheng, Changhua County (TW); Pei-Wen Liu, Hsinchu (TW); Ke-Wei Su, Hsinchu County (TW); Kuan-Lun Cheng, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 569 days.

(21) Appl. No.: 17/830,363

(22) Filed: Jun. 2, 2022

(65) Prior Publication Data
US 2023/0393093 A1    Dec. 7, 2023

(51) Int. Cl.
*G01N 27/414* (2006.01)
(52) U.S. Cl.
CPC ................. *G01N 27/4148* (2013.01)
(58) Field of Classification Search
CPC ............ G01N 27/4148; G01N 27/414; H01L 27/0688; H01L 27/088; H10D 86/60; H10D 84/83; H10D 88/00
See application file for complete search history.

(56) References Cited

U.S. PATENT DOCUMENTS

2017/0059514 A1*   3/2017   Hoffman ............ G01N 33/5438

* cited by examiner

*Primary Examiner* — Michele Fan
(74) *Attorney, Agent, or Firm* — JCIPRNET

(57) ABSTRACT

A semiconductor device includes a substrate, an interconnect, a second transistor, and a sensing film. The substrate includes devices disposed therein. The interconnect is disposed on the substrate and electrically coupled to the devices, where the interconnect includes a plurality of build-up layers and a through hole formed therein. The first transistor is disposed in the interconnect and vertically extends through at least one of the plurality of build-up layers, and the first transistor is electrically coupled to a first device of the devices through the interconnect. The second transistor is disposed in the interconnect and vertically extends through the at least one of the plurality of build-up layers, and the second transistor is electrically coupled to a second device of the devices through the interconnect, where the first transistor and the second transistor are laterally separated from one another through the through hole. The sensing film is disposed on the interconnect and further extends into the through hole, where the sensing layer is laterally disposed between the first transistor and the second transistor.

20 Claims, 22 Drawing Sheets

SEMICONDUCTOR DEVICE AND MANUFACTURING METHOD THEREOF

BACKGROUND

An ion-sensitive transistor is a transistor used for characterizing and/or identifying a target in a fluid. The target reacts with and/or binds to a sensing layer in the fluid to change a surface potential difference at the sensing layer. The change in the surface potential difference changes a threshold voltage of the ion-sensitive transistor, which may be used to characterize and/or identify the target. The ion-sensitive transistors are widely used in different life-science applications, ranging from environmental monitoring and basic life science research to Point-of-Care (PoC) in-vitro molecular diagnostics.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
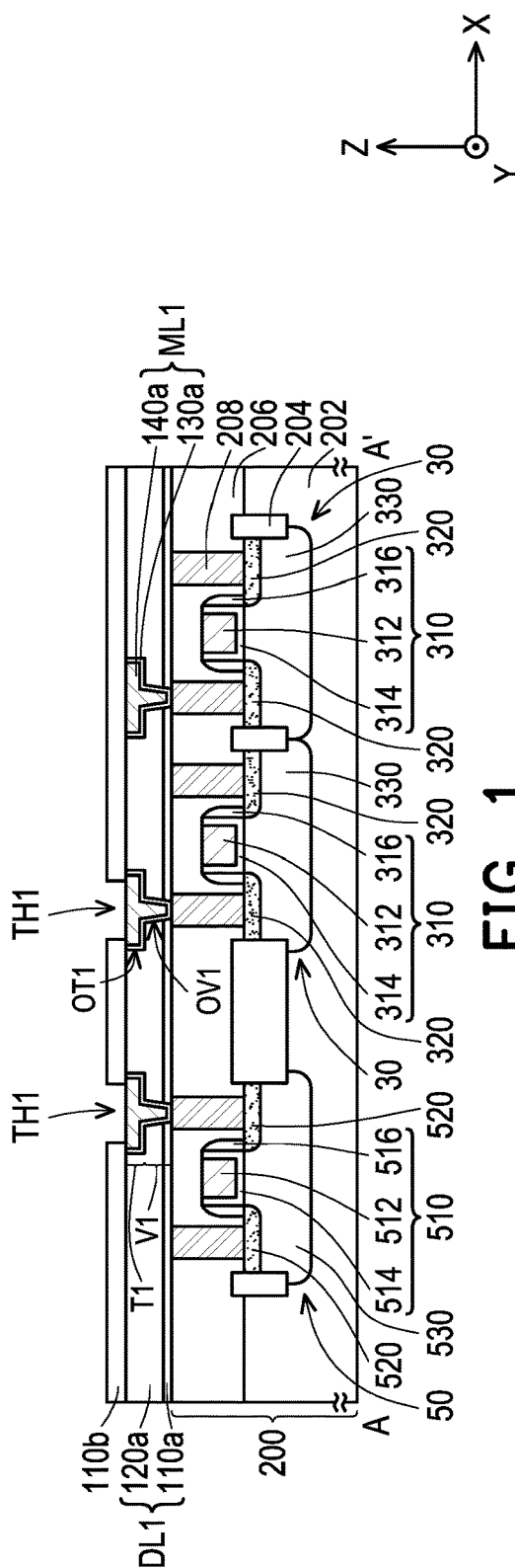
FIG. 1 through FIG. 11 are schematic cross-sectional views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

It should be appreciated that the following embodiment(s) of the disclosure provides applicable concepts that can be embodied in a wide variety of specific contexts. The specific embodiment(s) discussed herein is merely illustrative and is related to a semiconductor device including a sensor component (or device) of an ion-sensing transistor disposed in an interconnect formed during back-end-of-line (BEOL) processes, and is not intended to limit the scope of the disclosure. In accordance with some embodiments, one or more than one sensor component (or device) is embedded in an interconnect of the semiconductor device to arrive to a large sensing (or testing) area, where the sensor component (or device) is formed with a thin film transistor (TFT) having a channel of indium gallium zinc oxide (IGZO) with a gate dielectric of a high-k dielectric material. In the case, such thin film transistor is able to formed in the interconnect during the BEOL processes, thus the manufacturing process of the semiconductor device is simplified, thereby lowering the manufacturing cost.

Figure 12:
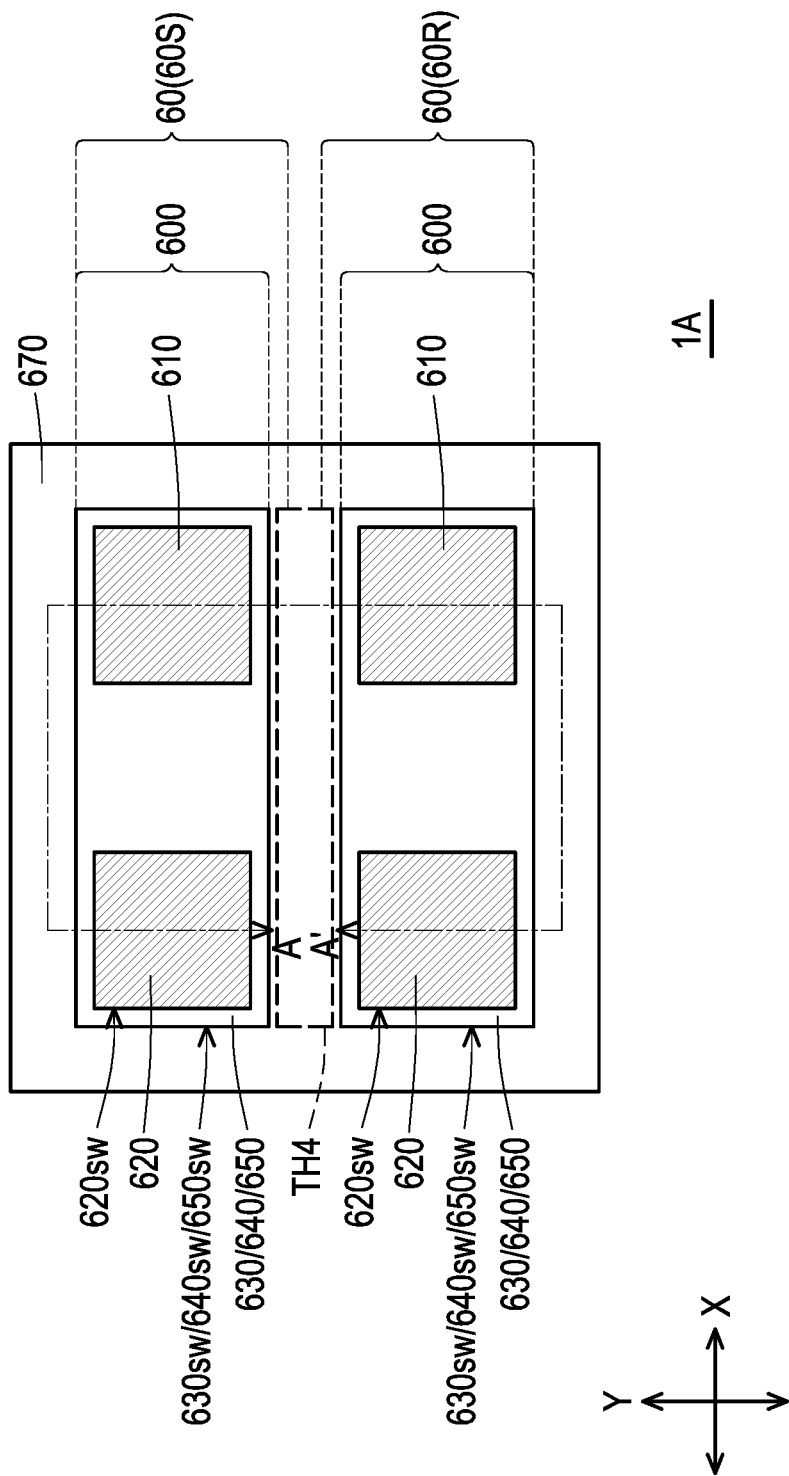
FIG. 12 is a schematic plane view illustrating a relative position between internal components of a semiconductor device in accordance with some embodiments of the disclosure.
Figure 13:
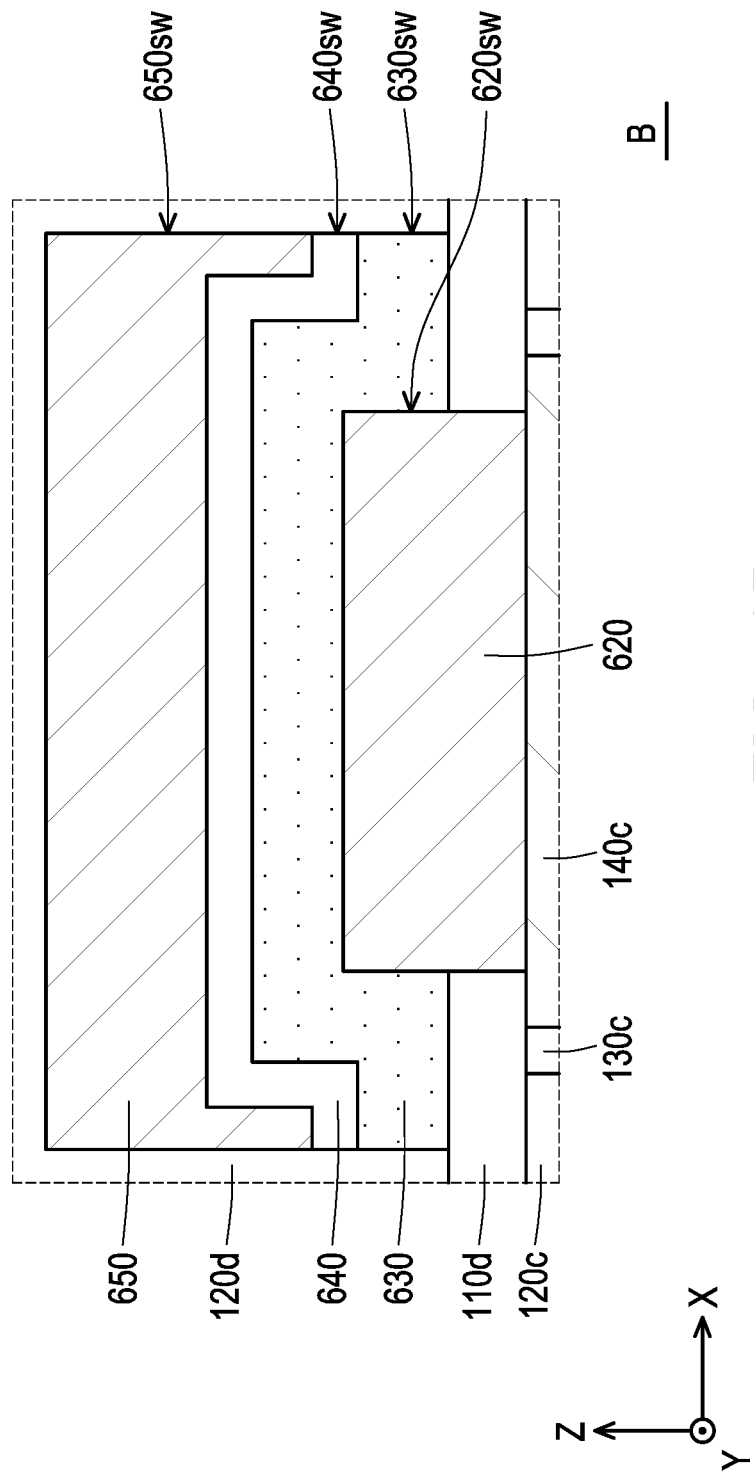
FIG. 13 is an enlarged and schematic cross-sectional view showing a part of internal components of a semiconductor device in accordance with some alternative embodiments of the disclosure.
Figure 14:
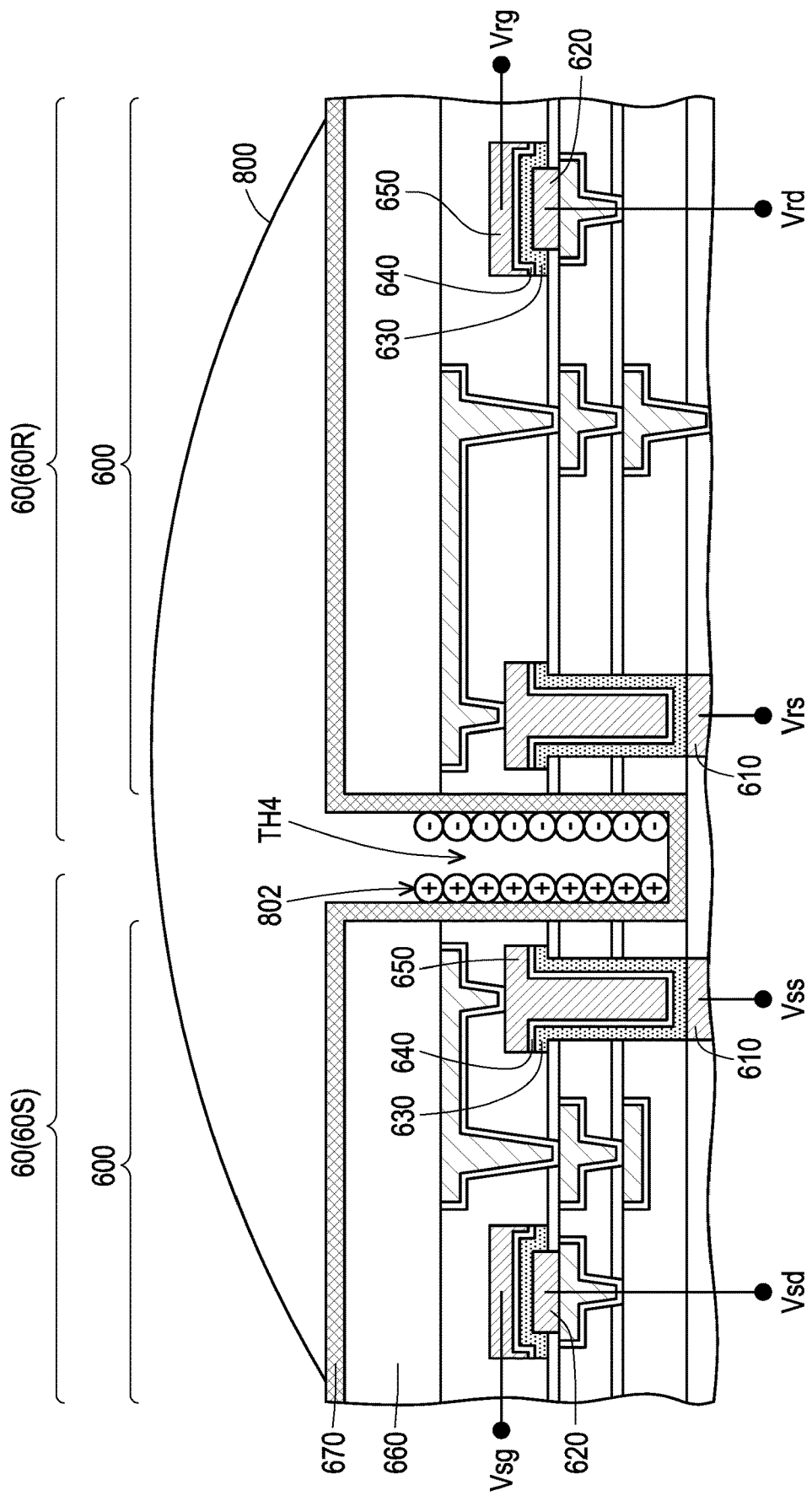
FIG. 14 is a schematic cross-sectional view of a semiconductor device during the operation in accordance with some embodiments of the disclosure.
Figure 15:
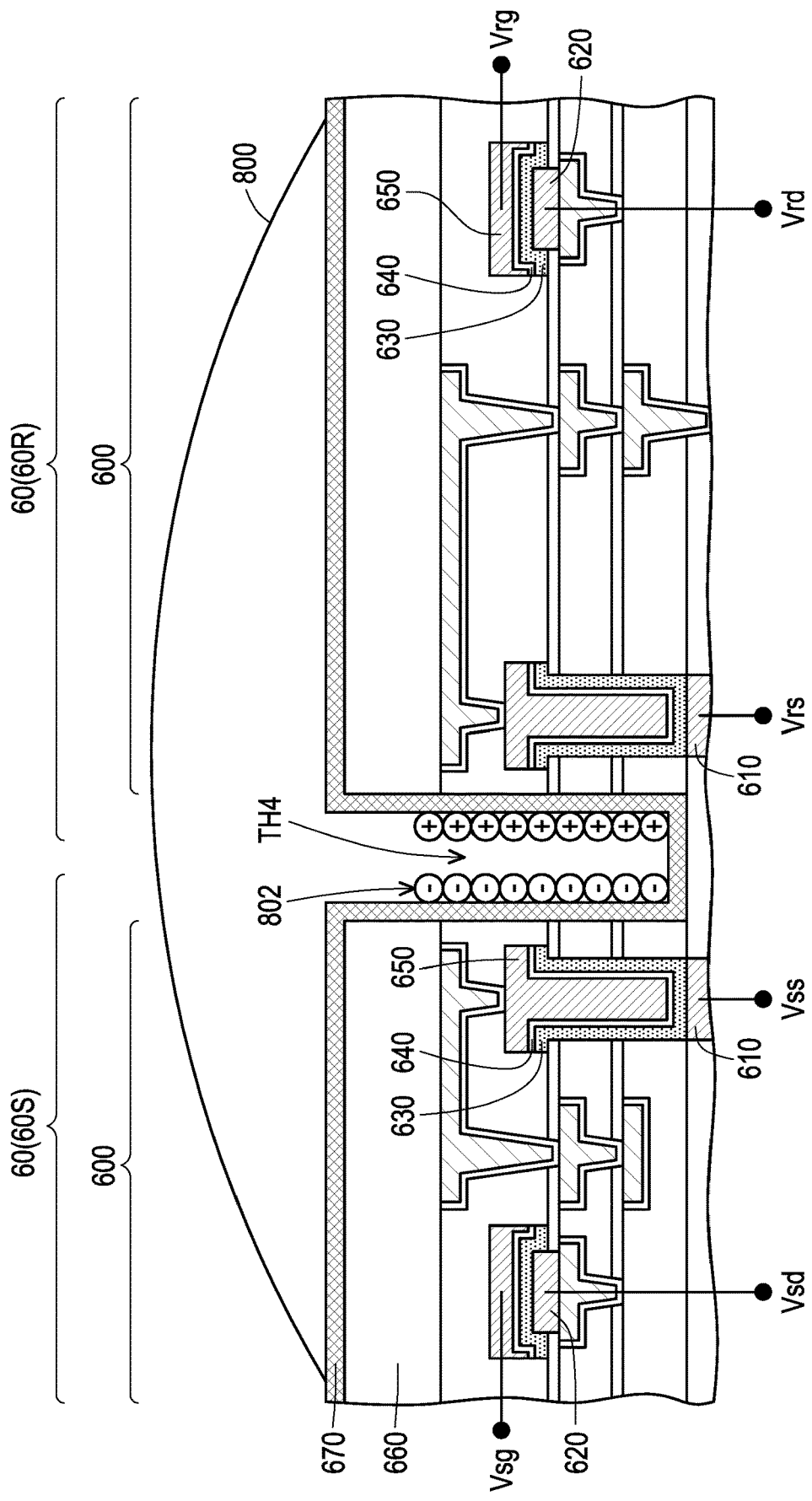
FIG. 15 is a schematic cross-sectional view of a semiconductor device during the operation in accordance with some alternative embodiments of the disclosure.

FIG. 1 through FIG. 11 are schematic cross-sectional views of various stages in a manufacturing method of a semiconductor device 1A in accordance with some embodiments of the disclosure. FIG. 12 is a schematic plane view illustrating a relative position between internal components of the semiconductor device 1A in accordance with some embodiments of the disclosure. FIG. 13 is an enlarged and schematic cross-sectional view showing a part of internal components of the semiconductor device 1A in accordance with some alternative embodiments of the disclosure. The schematic cross-sectional views of FIG. 1 through FIG. 11 are taken along a line A-A' depicted in the schematic plane view of the semiconductor device 1A in FIG. 12, and the enlarged and schematic cross-sectional view of FIG. 13 is outlined in a dash-box B of FIG. 11. FIG. 14 is a schematic cross-sectional view of the semiconductor device 1A during the operation in accordance with some embodiments of the disclosure. FIG. 15 is a schematic cross-sectional view of the semiconductor device 1A during the operation in accordance with some alternative embodiments of the disclosure. In embodiments, the manufacturing method is part of a wafer level packaging process. It is to be noted that the process steps described herein cover a portion of the manufacturing processes used to fabricate the semiconductor device involving a semiconductor component such as a semiconductor sensor. The embodiments are intended to provide further explanations but are not used to limit the scope of the disclosure. In the disclosure, it should be appreciated that the illustration of components throughout all figures is schematic and is not in scale.

Referring to FIG. 1, in some embodiments, an initial structure is provided. For example, the initial structure includes a substrate 200 including a wide variety of devices (also referred to as integrated circuit (IC) devices) formed in a semiconductor substrate 202 and a stack structure disposed on the substrate 200, as shown in FIG. 1. The devices may include active components, passive components, or a combination thereof. The devices may include integrated circuits devices. The devices may include transistors, capacitors, resistors, diodes, photodiodes, fuse devices, or other similar devices. The functions of the devices may include memory, processors, sensors, amplifiers, power distribution, input/output circuitry, or the like.

In some embodiments, the semiconductor substrate 202 includes a bulk semiconductor substrate, a crystalline silicon substrate, a doped semiconductor substrate (e.g., p-type semiconductor substrate or n-type semiconductor substrate), a semiconductor-on-insulator (SOI) substrate, or the like. In certain embodiments, the semiconductor substrate 202 includes one or more doped regions or various types of doped regions, depending on design requirements. In some embodiments, the doped regions are doped with p-type and/or n-type dopants. For example, the p-type dopants are boron or $BF_2$ and the n-type dopants are phosphorus or arsenic. The doped regions may be configured for an n-type metal-oxide-semiconductor (NMOS) transistor or a p-type MOS (PMOS) transistor. The substrate 200 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. Other substrates, such as a multi-layered or gradient substrate may also be used. In some alternative embodiments, the semiconductor substrate 202 includes a semiconductor substrate made of other suitable elemental semiconductor, such as diamond or germanium; a suitable compound semiconductor, such as gallium arsenide, silicon carbide, gallium phosphide, indium phosphide, indium arsenide and indium antimonide, an alloy semiconductor such as SiGe, GaAsP, AlInAs, AlGaAs, GaInAs, GaInP and GaInAsP or combinations thereof. For example, the semiconductor substrate 202 is a silicon bulk substrate.

As shown in FIG. 1, the devices (e.g., a transistor 30, a transistor 40, and a transistor 50) may be formed in the semiconductor substrate 202. In some embodiments, a plurality of isolation structures 204 are formed in the semiconductor substrate 202 for separating the devices, such as the transistor 30, the transistor 40, and the transistor 50. In certain embodiments, the isolation structures 204 are trench isolation structures. In other embodiments, the isolation structures 204 includes local oxidation of silicon (LOCOS) structures. In some embodiments, the insulator material of the isolation structures 204 includes silicon oxide, silicon nitride, silicon oxynitride, a spin-on dielectric material, or a low-k dielectric material. For example, the low-k dielectric material generally has a dielectric constant lower than 3.9. In one embodiment, the insulator material may be formed by chemical vapor deposition (CVD) such as high-density plasma CVD (HDP-CVD) and sub-atmospheric CVD (SACVD) or formed by spin-on. In certain embodiments, the devices (such as the transistor 30, the transistor 40, and the transistor 50) and the isolation structures 204 are formed in the substrate 200 during the front-end-of-line (FEOL) processes. In one embodiment, the transistors 30, 40, and 50 are formed following the complementary MOS (CMOS) processes. The number and configurations of the devices formed in the semiconductor substrate 202 should not be limited by the embodiments or drawings of this disclosure. It is understood that the number and configurations of the devices may have different material or configurations depending on product designs.

The transistor 30, the transistor 40, and the transistor 50 may be PMOS transistors. For example, the transistor 30 includes a gate structure 310 and source/drain regions 320 located at two opposite sides of the gate structure 310, where the gate structure 310 is formed on an n-well region 330, and the source/drain regions 320 are formed in the n-well region 330. In one embodiment, the gate structure 310 includes a gate electrode 312, a gate dielectric layer 314 and a gate spacer 316. The gate dielectric layer 314 may spread between the gate electrode 312 and the semiconductor substrate 202, and may or may not further cover a sidewall of the gate electrode 312. The gate spacer 316 may laterally surround the gate electrode 312 and the gate dielectric layer 314. In one embodiment, the source/drain regions 320 include doped regions of p-type dopant that are formed in the n-well region 330 by ion implantation. In an alternative embodiment, the source/drain regions 320 include epitaxial structures formed in and protruding from a surface of the semiconductor substrate 202, that are formed by epitaxial growth. For example, the transistor 40 includes a gate structure 410 and source/drain regions 420 located at two opposite sides of the gate structure 410, where the gate structure 410 is formed on an n-well region 430, and the source/drain regions 420 are formed in the n-well region 430. In one embodiment, the gate structure 410 includes a gate electrode 412, a gate dielectric layer 414 and a gate spacer 416. The gate dielectric layer 414 may spread between the gate electrode 412 and the semiconductor substrate 202, and may or may not further cover a sidewall of the gate electrode 412. The gate spacer 416 may laterally surround the gate electrode 412 and the gate dielectric layer 414. In one embodiment, the source/drain regions 420 include doped regions of p-type dopant that are formed in the n-well region 430 by ion implantation. In an alternative embodiment, the source/drain regions 420 include epitaxial structures formed in and protruding from a surface of the semiconductor substrate 202, that are formed by epitaxial growth. For example, the transistor 50 includes a gate structure 510 and source/drain regions 520 located at two opposite sides of the gate structure 510, where the gate structure 510 is formed on an n-well region 530, and the source/drain regions 520 are formed in the n-well region 530. In one embodiment, the gate structure 510 includes a gate electrode 512, a gate dielectric layer 514 and a gate spacer 516. The gate dielectric layer 514 may spread between the gate electrode 512 and the semiconductor substrate 202, and may or may not further cover a sidewall of the gate electrode 512. The gate spacer 516 may laterally surround the gate electrode 512 and the gate dielectric layer 514. In one embodiment, the source/drain regions 520 include doped regions of p-type dopant that are formed in the n-well region 530 by ion implantation. In an alternative embodiment, the source/drain regions 520 include epitaxial structures formed in and protruding from a surface of the semiconductor substrate 202, that are formed by epitaxial growth.

Alternatively, the transistor 30, the transistor 40, and the transistor 50 may be NMOS transistors. For example, the transistor 30 includes a gate structure 310 and source/drain regions 320 located at two opposite sides of the gate structure 310, where the gate structure 310 is formed on an p-well region 330, and the source/drain regions 320 are formed in the p-well region 330. In one embodiment, the gate structure 310 includes a gate electrode 312, a gate dielectric layer 314 and a gate spacer 316. The gate dielectric layer 314 may spread between the gate electrode 312 and the semiconductor substrate 202, and may or may not further cover a sidewall of the gate electrode 312. The gate spacer 316 may laterally surround the gate electrode 312 and the gate dielectric layer 314. In one embodiment, the source/drain regions 320 include doped regions of n-type dopant that are formed in the p-well region 330 by ion implantation. In an alternative embodiment, the source/drain regions 320 include epitaxial structures formed in and protruding from a surface of the semiconductor substrate 202, that are formed by epitaxial growth. For example, the transistor 40 includes a gate structure 410 and source/drain regions 420 located at two opposite sides of the gate structure 410, where the gate structure 410 is formed on an p-well region 430, and the source/drain regions 420 are formed in the p-well region 430. In one embodiment, the gate structure 410 includes a gate electrode 412, a gate dielectric layer 414 and a gate spacer 416. The gate dielectric layer 414 may spread between the gate electrode 412 and the semiconductor substrate 202, and may or may not further cover a sidewall of the gate electrode 412. The gate spacer 416 may laterally surround the gate electrode 412 and the gate dielectric layer 414. In one embodiment, the source/drain regions 420 include doped regions of n-type dopant that are formed in the p-well region 430 by ion implantation. In an alternative embodiment, the source/drain regions 420 include epitaxial structures formed in and protruding from a surface of the semiconductor substrate 202, that are formed by epitaxial growth. For example, the transistor 50 includes a gate structure 510 and source/drain regions 520 located at two opposite sides of the gate structure 510, where the gate structure 510 is formed on an p-well region 530, and the source/drain regions 520 are formed in the p-well region 530. In one embodiment, the gate structure 510 includes a gate electrode 512, a gate dielectric layer 514 and a gate spacer 516. The gate dielectric layer 514 may spread between the gate electrode 512 and the semiconductor substrate 202, and may or may not further cover a sidewall of the gate electrode 512. The gate spacer 516 may laterally surround the gate electrode 512 and the gate dielectric layer 514. In one embodiment, the source/drain regions 520 include doped regions of n-type dopant that are formed in the p-well region 530 by ion implantation. In an alternative embodiment, the source/drain regions 520 include epitaxial structures formed in and protruding from a surface of the semiconductor substrate 202, that are formed by epitaxial growth.

In further alternative embodiments, one of the transistors 30, 40, and 50 may be the different type than the rest of the transistors 30, 40, and 50. The disclosure is not limited thereto. For example, the transistor 30 and the transistor 40 are PMOS transistors, and the transistor 50 is a NMOS transistor; or vice versa. OR, the transistor 40 and the transistor 50 are PMOS transistors, and the transistor 30 is a NMOS transistor; or vice versa. OR, the transistor 30 and the transistor 50 are PMOS transistors, and the transistor 40 is a NMOS transistor; or vice versa.

Only three devices formed in the semiconductor substrate 202 are shown in FIG. 1 for illustrative purposes, however the disclosure is not limited thereto. The number of the devices formed in the semiconductor substrate 202 may be more than three. In other words, each of the transistors 30, 40, and 50 may represent one or multiple transistors 30 (with same or different types), one or multiple transistors 40 (with same or different types), and one or multiple transistors 50 (with same or different types), respectively.

As illustrated in FIG. 1, for example, the substrate 200 further includes a dielectric layer 206 stacked on the semiconductor substrate 202 and a plurality of contact plugs 208 penetrating through the dielectric layer 206 to electrically connect to the transistors 30, 40, and 50. In certain embodiments, the dielectric layer 206 and the contact plugs 208 are also formed in the structure 200 during the FEOL processes. The dielectric layer 206 may laterally surround the gate structures 310, 410, 510 and cover the source/drain regions 320, 420, 520 for providing protections to the devices formed in/on the semiconductor substrate 202. Some of the contact plugs 208 may penetrate through the dielectric layer 206 in order to establish electrical connection with the source/drain regions 320, 420 and 520, while others of the contact plugs 208 (not shown) may penetrate through the dielectric layer 206 to establish electrical connection with the gate electrodes (e.g. the gate electrodes 312, 412, 512) of the gate structures 310, 410 and 510, in order to provide terminals for electrical connections to later-formed components (e.g. an interconnect or interconnect structure) or external components.

The dielectric layer 206 may be referred to as an interlayer dielectric (ILD) layer, while the contact plugs 208 may be referred to as metal contacts or metallic contacts. For example, the contact plugs 208 electrically connected to the source/drain regions 320, 420, 520 are referred to as source/drain contacts, and the contact plugs 208 electrically connected to the gate electrodes 312, 412, 512 are referred to as gate contacts. In some embodiments, the contact plugs 208 may include copper (Cu), copper alloys, nickel (Ni), aluminum (Al), manganese (Mn), magnesium (Mg), silver (Ag), gold (Au), tungsten (W), a combination of thereof, or the like. The contact plugs 208 may be formed by, for example, plating such as electroplating or electroless plating, CVD such as plasma enhanced CVD (PECVD), atomic layer deposition (ALD), and physical vapor deposition (PVD), a combination thereof, or the like. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the dielectric layer 206 includes silicon oxide, silicon nitride, silicon carbide, silicon oxynitride, silicon carbonitride, silicon carbide oxynitride, spin-on glass (SOG), phosphosilicate glass (PSG), borosilicate glass (BSG), borophosphosilicate glass (BPSG), fluorinated silica glass (FSG), carbon doped silicon oxide (e.g., SiCOH), polyimide, and/or a combination thereof. In alternative embodiments, the dielectric layer 206 include low-k dielectric materials. For example, the low-k dielectric material generally has a dielectric constant lower than 3.9. Examples of low-k dielectric materials may include BLACK DIAMOND® (Applied Materials of Santa Clara, Calif.), Xerogel, Aerogel, amorphous fluorinated carbon, Parylene, BCB, Flare, SILK® (Dow Chemical, Midland, Mich.), hydrogen silsesquioxane (HSQ) or fluorinated silicon oxide (SiOF), and/or a combination thereof. It is understood that the dielectric layer 206 may include one or more dielectric materials. For example, the dielectric layer 206 include a single-layer structure or a multilayer structure. In some embodiments, the dielectric layer 206 is formed to a suitable thickness by CVD such as flowable chemical vapor deposition (FCVD), HDP-CVD, and SACVD, spin-on, sputtering, or other suitable methods.

A seed layer (not shown) may be optionally formed between the dielectric layer 206 and the contact plugs 208. That is, for example, the seed layer covers a bottom surface and sidewalls of each of the contact plugs 208. In some embodiments, the seed layer is a metal layer, which may be a single layer or a composite layer comprising a plurality of sub-layers formed of different materials. In some embodiments, the contact plugs 208 includes copper layer and the seed layer includes a titanium layer and a copper layer over the titanium layer. The seed layer is formed using, for example, PVD or the like. In one embodiment, the seed layer may be omitted.

In addition, an additional barrier layer or adhesive layer (not shown) may be optionally formed between the contact plugs 208 and the dielectric layer 206. Owing to the additional barrier layer or adhesive layer, it is able to prevent the seed layer and/or the contact plugs 208 from diffusing to the underlying layers and/or the surrounding layers. The additional barrier layer or adhesive layer may include Ti, TiN, Ta, TaN, a combination thereof, a multilayer thereof, or the like, and may be formed using CVD, ALD, PVD, a combination thereof, or the like. In an alternative embodiment of which the seed layer is included, the additional barrier layer or adhesive layer is interposed between the dielectric layer 206 and the seed layer, and the seed layer is interposed between the contact plugs 208 and the additional barrier layer or adhesive layer. In one embodiment, the additional barrier layer or adhesive layer may be omitted.

In some embodiments, a build-up layer L1 is formed on the substrate 200. For example, as show in FIG. 1, the build-up layer L1 of an interconnect 100 (depicted in FIG. 11) is disposed on (e.g., in physical contact with) and electrically coupled to the devices formed in the semiconductor substrate 202 through some of the contact plugs 208 for providing routing function thereto. The formation of the build-up layer L1 may include, but not limited to, forming a blanket layer of a first dielectric material (not shown) over the substrate 200 to cover up the devices such as the transistors 30, 40, and 50; forming a blanket layer of a second dielectric material (not shown) over the first dielectric material blanket layer so to sandwich the first dielectric material blanket layer between the second dielectric material blanket layer and the substrate 200; patterning the first dielectric material blanket layer and the second dielectric material blanket layer to form a first dielectric layer 110a and a second dielectric layer 120a disposed thereon, where a plurality of openings OP1 penetrate through the first dielectric layer 110a and the second dielectric layer 120a; forming a seed layer 130a in the openings OP1; and forming a conductive material in the opening OP1 to form a conductive layer 140a over the seed layer 130a so to form a metallization layer ML1 in the openings OP1, thereby forming the build-up layer L1. For example, as shown in FIG. 1, the metallization layer ML1 of the build-up layer L1 includes the seed layer 130a and the conductive layer 140a standing thereon and electrically connected thereto, and is embedded in a dielectric structure DL1 of the build-up layer L1, where the dielectric structure DL1 includes the first dielectric layer 110a and the second dielectric layer 120a stacked thereon. As shown in FIG. 1, for example, the conductive layer 140a is electrically connected to the transistors 30, 40, and 50 through the seed layer 130a and the conductive plugs 208.

In some embodiments, the first dielectric layer 110a and the second dielectric layer 120a have different materials. For example, the first dielectric layer 110a includes a silicon carbide (SiC) layer, a silicon nitride ($Si_3N_4$) layer, an aluminum oxide layer, or the like. For example, the second dielectric layer 120a includes a silicon-rich oxide (SRO) layer. In some embodiments, the second dielectric layer 120a is referred to as an inter-metal dielectric (IMD) layer which may be made of a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. In some alternative embodiments, the first dielectric layer 110a and the second dielectric layer 120a have different etching selectivities. In the case, the first dielectric layer 110a may be referred to as an etching stop layer to prevent the underlying elements (e.g., the contact plugs 208 and the dielectric layer 206) from damage caused by the overetching.

In some embodiments, the first dielectric material blanket layer and the second dielectric material blanket layer are patterned through a set(s) of photolithography and etching processes. The etching process may include a dry etching, a wet etching, or a combination thereof. After the etching process, a cleaning step may be optionally performed, for example to clean and remove the residue generated from the etching process. However, the disclosure is not limited thereto, and the etching process may be performed through any other suitable method. The openings OP1 each may include a trench hole OT1 and a via hole OV1 underlying and spatially communicated to the trench hole OT1. For example, the trench holes OT1 are formed in the second dielectric layer 120a and extend from an illustrated top surface of the second dielectric layer 120a to a position inside the second dielectric layer 120a. For example, the via holes OV1 are formed in the second dielectric layer 120a and the first dielectric layer 110a and extend from the position inside the second dielectric layer 120a to an illustrated bottom surface of the first dielectric layer 110a. The position may be about ½ to about ⅓ of a thickness of the second dielectric layer 120a; however, the disclosure is not limited thereto. In some embodiments, the openings OP1 includes a dual damascene structure. The formation of the openings OP1 is not limited to the disclosure. The formation of opening OP1 (with the dual damascene structure) can be formed by any suitable forming process, such as a via first approach or a trench first approach.

In one embodiment, one or more than one opening OP1 has one trench hole OT1 and one via hole OV1 for providing vertical connection connecting overlying and underlying elements thereof. The disclosure is not limited thereto; alternatively, one or more than one opening OP1 has one trench hole OT1 and multiple via holes OV1 for providing not only vertical connection (connecting overlying and underlying elements thereof) but also horizontal connection (connecting elements laterally arranged to each other).

As shown in FIG. 1, a lateral size of the trench holes OT1 may be greater than a lateral size of the via holes OV1. In some embodiments, a sidewall of each of the via holes OV1 is a slant sidewall, where lateral sizes of the via holes OV1 are gradually decreased in a direction from an illustrated top surface of the semiconductor substrate 202 toward an illustrated bottom surface of the semiconductor substrate 202. In alternative embodiments, the sidewall of each of the via holes OV1 is a vertical sidewall, where the lateral sizes of the via holes OV1 are substantially constant. In some embodiments, a sidewall of each of the trench holes OT1 is a vertical sidewall, where lateral sizes of the trench holes OT1 are substantially constant. In alternative embodiments, the sidewall S2 of each of the trench holes OT1 is a slant sidewall, where the lateral sizes of the trench holes OT1 are gradually decreased in the direction from the illustrated top surface of the semiconductor substrate 202 toward the illustrated bottom surface of the semiconductor substrate 202. The sidewall of one via hole OV1 and the sidewall of a respective one trench hole OT1 may be collectively referred to as a sidewall of one opening OP1. For illustrative purposes, the number of the openings OP1 shown in FIG. 1 does not limit the disclosure, and may be designated and selected based on the demand and layout design. As illustrated in FIG. 1, portions of the metallization layer ML1 formed in the trench holes OT1 may be referred to as conductive traces or conductive wires T1 horizontally extended (e.g., extending in a direction X and/or a direction Y), and portions of the metallization layer ML1 formed in the via holes OV1 may be referred to as conductive vias V1 vertically extended (e.g., extending in a direction Z). The directions X, Y and Z may be different from each other. For example, as shown in FIG. 1, directions X, Y and Z are substantially perpendicular to each other.

In one embodiment, one or more than one conductive feature of the metallization layer ML1 has one conductive traces or conductive wires T1 and one conductive via V1 for vertical connection between overlying and underlying elements thereof. The disclosure is not limited thereto; alternatively, one or more than one conductive feature of the metallization layer ML1 has one conductive traces or conductive wires T1 and multiple conductive vias V1 for providing not only vertical connection between overlying and underlying elements thereof but also horizontal connection between elements laterally arranged to each other.

In some embodiment, the seed layer 130a and the conductive layer 140a are sequentially formed in the openings OP1 by, but not limited to, conformally forming a blanket layer made of metal or metal alloy materials over the dielectric structure DL1 and extending into the openings OP1, so to line the sidewalls of the openings OPt; filling the conductive material in the openings OPt; and removing excess amount of the blanket layer made of metal or metal alloy materials and the conductive material over the illustrated top surface of the second dielectric layer 120a, thereby the metallization layer ML1 including the seed layer 130a and the conductive layer 140a is manufactured. The removal may be performed by a planarizing process such as a mechanical grinding, a chemical mechanical polishing (CMP), and/or an etching process. The etching process may include a dry etching, a wet etching, or a combination thereof. After the planarizing process, a cleaning process may be optionally performed, for example to clean and remove the residue generated from the planarizing process. However, the disclosure is not limited thereto, and the planarizing process may be performed through any other suitable method. Herein, when a layer is described as conformal or conformally formed, it indicates that the layer has a substantially equal thickness extending along the region on which the layer is formed.

In some embodiments, the seed layer 130a is referred to as a metal layer, which can be a single layer or a composite layer including a plurality of sub-layers formed of different materials. In some embodiments, the seed layer 130a includes titanium, copper, molybdenum, tungsten, titanium nitride, titanium tungsten, combinations thereof, or the like. For example, the seed layer 130a may include a titanium layer and a copper layer over the titanium layer. The seed layer 130a may be formed using, for example, sputtering, PVD, or the like. The seed layer 130a may have a thickness (as measured in the direction Z) of about 1 nm to about 50 nm, although other suitable thickness may alternatively be utilized.

In some embodiments, a material of the conductive material includes a suitable conductive material, such as metal and/or metal alloy. For example, the conductive material can be Al, aluminum alloys, Cu, copper alloys, or combinations thereof (e.g., AlCu), the like, or combinations thereof. In some embodiments, the conductive material is formed by plating process or any other suitable method, which the plating process may include electroplating or electroless plating, or the like. In alternative embodiments, the conductive material may be formed by deposition. The disclosure is not limited thereto. In the case, an illustrated top surface of the metallization layer ML1 is substantially level with an illustrated top surface of the dielectric structure DLJ. That is, the illustrated top surface of the metallization layer ML1 is substantially coplanar to the illustrated top surface of the dielectric structure DL1.

Continued on FIG. 1, after the formation of the build-up layer L1, a first dielectric layer 110b may be formed on the build-up layer L1. As shown in FIG. 1, the first dielectric layer 110b of a build-up layer L2 (depicted in FIG. 3 through FIG. 11) of the interconnect 100 may be disposed on (e.g., in physical contact with) the dielectric layer DL1 and the metallization layer ML1 of the build-up layer L1. For example, the first dielectric layer 110b includes a plurality of through holes TH1 penetrating therethrough, where the through hole TH1 accessibly reveals portions of an illustrated top surface of the metallization layer ML1. The formation and material of the first dielectric layer 110b may be similar to or substantially identical to the forming process and material of the dielectric layer 110a as previously described, and thus are not repeated therein for brevity. Only two through holes TH1 are shown in FIG. 1 for illustrative purpose, and are not intended to limit the disclosure. The number of the through holes TH1 formed in the first dielectric layer 110b may be more than two depending on the demand and design requirement. As shown in FIG. 1, for example, sidewalls of the through holes TH1 are vertical sidewalls. In the case, lateral sizes of the through holes TH1 are substantially constant. However, the disclosure is not limited thereto; alternatively, the sidewalls of the through holes TH1 may be slant sidewalls, where the lateral sizes of the through holes TH1 may be gradually decreased in the direction from the illustrated top surface of the semiconductor substrate 202 toward the illustrated bottom surface of the semiconductor substrate 202. In some embodiments, the first dielectric layer 110b include a thickness (as measured in the direction Z) approximately in the range of 1 nm to 10 nm, although other suitable thickness may alternatively be utilized.

Figure 2:
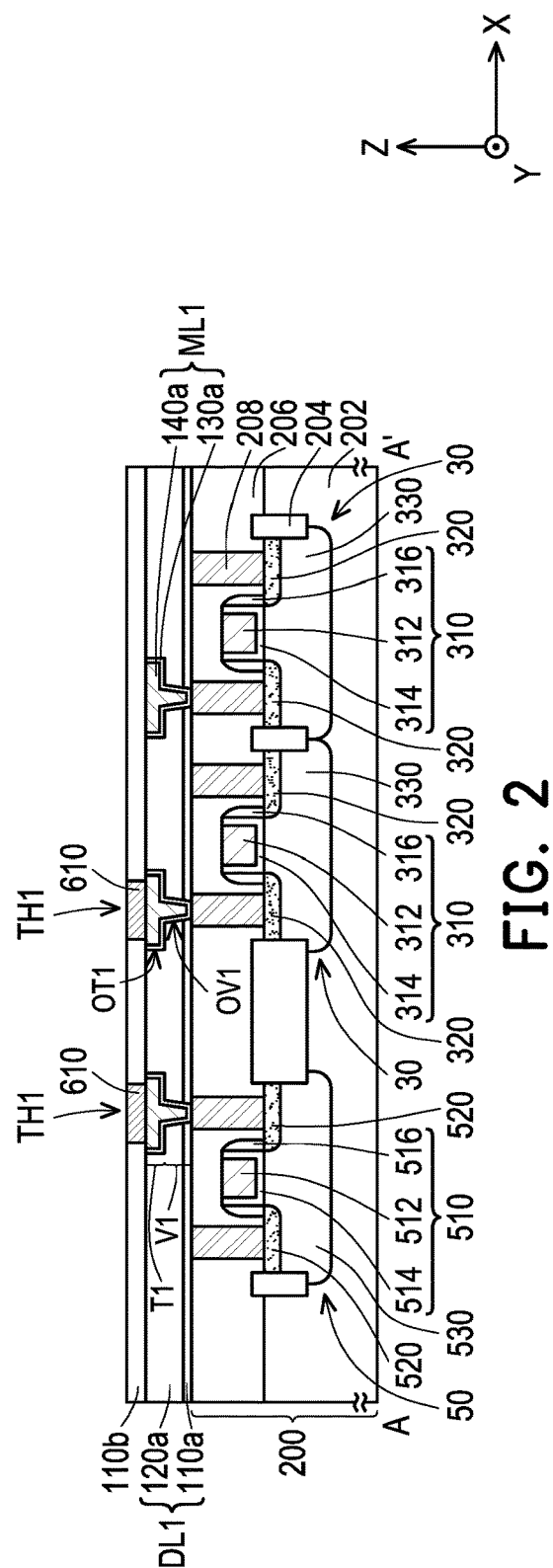

Referring to FIG. 2, in some embodiments, a plurality of first source/drain regions 610 are formed in the first dielectric layer 110b. For example, as shown in FIG. 2, the first source/drain regions 610 are disposed in the through holes TH1, respectively. In the case, the through holes TH1 are filled by the first source/drain regions 610. In some embodiments, the first source/drain regions 610 are disposed on (e.g., in physical contact with) and electrically connected the metallization layer ML1 of the build-up layer L1. In the case, the first source/drain regions 610 are electrically coupled to different devices (such as 40 and 50) formed in the semiconductor substrate 202 through the build-up layer L1 (e.g., the metallization layer ML1) and some of the conductive plugs 208. That is, the first source/drain regions 610 may be biased by different devices formed in the semiconductor substrate 202.

The formation of the first source/drain regions 610 may include, but not limited to, filling a conductive material in the through holes TH1 formed in the first dielectric layer 110b; and removing excess amount of the conductive material over an illustrated top surface of the first dielectric layer 110b to form the first source/drain regions 610. The removal may be performed by a planarizing process such as a mechanical grinding, a chemical mechanical polishing (CMP), and/or an etching process. The etching process may include a dry etching, a wet etching, or a combination thereof. After the planarizing process, a cleaning process may be optionally performed, for example to clean and remove the residue generated from the planarizing process. However, the disclosure is not limited thereto, and the planarizing process may be performed through any other suitable method. In some embodiments, illustrated top surfaces of the first source/drain regions 610 are substantially level with the illustrate top surface of the first dielectric layer 110b. That is, the illustrated top surfaces of the first source/drain regions 610 are substantially coplanar to the illustrate top surface of the first dielectric layer 110b.

In some embodiments, the first source/drain regions 610 may be a metal, a metal oxide, the metal nitride, and the metal silicide, the disclosure is not limited thereto. The metal, the metal oxide, the metal nitride, and the metal silicide may include a metal element, such as Ti, Ta, W, Mo, Ni, Co, Ru, Au, Ag, Pt, Mn, Cu, Al, other conductive materials with a work function compatible with the substrate material, or combinations thereof. In some embodiments, the first source/drain regions 610 include TiN, TiAl, TiAlN, TaN, NiSi, CoSi, or the like. For example, the first source/drain regions 610 are made of TiN. In some embodiments, the first source/drain regions 610 include a thickness (as measured in the direction Z) approximately in the range of 5 nm to 10 nm, although other suitable thickness may alternatively be utilized. The first source/drain regions 610 may be formed using a suitable process such as ALD, CVD, PVD, plating, or combinations thereof. The disclosure is not limited thereto. The plating process may include electroplating or electroless plating, or the like.

Figure 3:
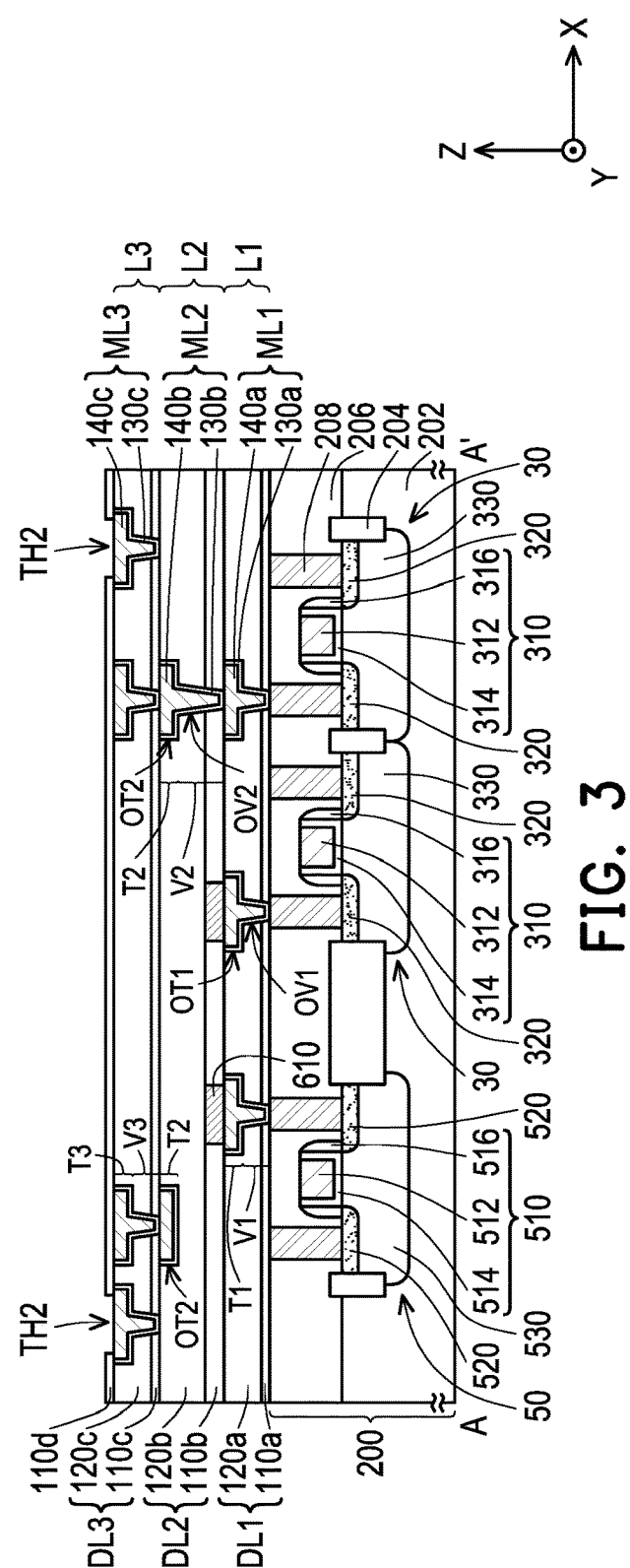

Referring to FIG. 3, in some embodiments, a second dielectric layer 120b, a seed layer 130b, and a conductive layer 140b are formed over the structure depicted in FIG. 2 to form the build-up layer L2 over the build-up layer L1, and then a build-up layer L3 is sequentially formed over the build-up layer L2. As shown in FIG. 3, for example, the build-up layer L2 is disposed on (e.g., in physical contact with) and electrically connected to the build-up layer L1, and thus is electrically coupled to the devices formed in the semiconductor substrate 202 through some of the contact plugs 208 and the build-up layer L1 for providing routing function thereto. The build-up layer L3 is disposed on (e.g., in physical contact with) and electrically connected to the build-up layer L2, and thus is electrically coupled to the devices formed in the semiconductor substrate 202 through some of the contact plugs 208 and the build-up layers L1-L2 for providing routing function thereto. In some embodiments, the build-up layer L1 is sandwiched between the semiconductor substrate 202 and the build-up layer L2, and the build-up layer L2 is sandwiched between the build-up layer L1 and the build-up layer L3. The build-up layers L1 through L3 are electrically coupled to each other. The build-up layers L1-L3 may be referred to as a first build-up layer L1, a second build-up layer L2, and a third build-up layer L3, respectively. The formation, material, and configuration of components of each of the build-up layer L2 and the build-up layer L3 are similar to or substantially identical to the forming process, material, and configuration of the components of the build-up layer L1 as aforementioned above, and thus are not repeated herein for brevity.

Continued on FIG. 3, for example, the build-up layer L2 includes a dielectric structure DL2 and a metallization layer ML2 disposed therein. The dielectric structure DL2 may include the first dielectric layer 110b and the second dielectric layer 120b disposed thereon, where the dielectric structure DL2 may be penetrated by a plurality of opening OP2. In the case, the metallization layer ML2 is disposed inside the openings OP2, where the metallization layer ML2 includes a seed layer 130b and a conductive layer 140b disposed thereon, the seed layer 130b lines sidewalls of the openings OP2, and the conductive layer 140b directly stacked on the seed layer 130b. The conductive layer 140b of the metallization layer ML2 is electrically coupled to the conductive layer 140a of the metallization layer ML1 through the seed layer 130b, for example, as shown in FIG. 3. The openings OP2 each may include a trench hole OT2 and a via hole OV2 underlying and spatially communicated to the trench hole OT2. For example, the trench holes OT2 are formed in the second dielectric layer 120b and extend from an illustrated top surface of the second dielectric layer 120b to a position inside the second dielectric layer 120b. For example, the via holes OV2 are formed in the second dielectric layer 120b and the first dielectric layer 110b and extend from the position inside the second dielectric layer 120b to an illustrated bottom surface of the first dielectric layer 110b. The position may be about ½ to about ⅓ of a thickness of the second dielectric layer 120b; however, the disclosure is not limited thereto. As illustrated in FIG. 3, portions of the metallization layer ML2 formed in the trench holes OT2 may be referred to as conductive traces or conductive wires T2 horizontally extended (e.g., extending in the direction X and/or the direction Y), and portions of the metallization layer ML2 formed in the via holes OV2 may be referred to as conductive vias V2 vertically extended (e.g., extending in the direction Z). In the case, an illustrated top surface of the metallization layer ML2 is substantially level with an illustrated top surface of the dielectric structure DL2. That is, the illustrated top surface of the metallization layer ML2 is substantially coplanar to the illustrated top surface of the dielectric structure DL2.

In some embodiments, the build-up layer L3 includes a dielectric structure DL3 and a metallization layer ML3 disposed therein. The dielectric structure DL3 may include a first dielectric layer 110c and a second dielectric layer 120c disposed thereon, where the dielectric structure DL3 may be penetrated by a plurality of opening OP3. In the case, the metallization layer ML3 is disposed inside the openings OP3, where the metallization layer ML3 includes a seed layer 130c and a conductive layer 140c disposed thereon, the seed layer 130c lines sidewalls of the openings OP3, and the conductive layer 140c directly stacked on the seed layer 130c. The conductive layer 140c of the metallization layer ML3 is electrically coupled to the conductive layer 140b of the metallization layer ML2 through the seed layer 130c, for example, as shown in FIG. 3. The openings OP3 each may include a trench hole OT3 and a via hole OV3 underlying and spatially communicated to the trench hole OT3. For example, the trench holes OT3 are formed in the second dielectric layer 120c and extend from an illustrated top surface of the second dielectric layer 120c to a position inside the second dielectric layer 120c. For example, the via holes OV3 are formed in the second dielectric layer 120c and the first dielectric layer 110c and extend from the position inside the second dielectric layer 120c to an illustrated bottom surface of the first dielectric layer 110c. The position may be about ½ to about ⅓ of a thickness of the second dielectric layer 120c; however, the disclosure is not limited thereto. As illustrated in FIG. 3, portions of the metallization layer ML3 formed in the trench holes OT3 may be referred to as conductive traces or conductive wires T3 horizontally extended (e.g., extending in the direction X and/or the direction Y), and portions of the metallization layer ML3 formed in the via holes OV3 may be referred to as conductive vias V3 vertically extended (e.g., extending in the direction Z). In the case, an illustrated top surface of the metallization layer ML3 is substantially level with an illustrated top surface of the dielectric structure DL3. That is, the illustrated top surface of the metallization layer ML3 is substantially coplanar to the illustrated top surface of the dielectric structure DL3.

The configurations and modifications of the openings OP1 and the metallization layer ML1 of the build-up layer L1 as described in FIG. 1 may also applied to (e.g., adopted by) the openings OP2 and the metallization layer ML2 of the build-up layer L2 and/or the openings OP3 and the metallization layer ML3 of the build-up layer L3. The disclosure is not limited thereto.

Continued on FIG. 3, after the formation of the build-up layer L3, a first dielectric layer 110d may be formed on the build-up layer L3, where a plurality of through holes TH2 are formed in the first dielectric layer 110d. As shown in FIG. 3, the first dielectric layer 110d of a build-up layer L4 (depicted in FIG. 8 through FIG. 11) of the interconnect 100 may be disposed on (e.g., in physical contact with) the dielectric layer DL3 and the metallization layer ML3 of the build-up layer L3. For example, the first dielectric layer 110d includes a plurality of through holes TH2 penetrating therethrough, where the through hole TH2 accessibly reveals portions of an illustrated top surface of the metallization layer ML3. The formation and material of the first dielectric layer 110d may be similar to or substantially identical to the forming process and material of the dielectric layer 110a as previously described, and thus are not repeated therein for brevity. Only two through holes TH2 are shown in FIG. 3 for illustrative purpose, and are not intended to limit the disclosure. The number of the through holes TH2 formed in the first dielectric layer 110d may be more than two depending on the demand and design requirement. As shown in FIG. 3, for example, sidewalls of the through holes TH2 are vertical sidewalls. In the case, lateral sizes of the through holes TH2 are substantially constant. However, the disclosure is not limited thereto; alternatively, the sidewalls of the through holes TH2 may be slant sidewalls, where the lateral sizes of the through holes TH2 may be gradually decreased in the direction from the illustrated top surface of the semiconductor substrate 202 toward the illustrated bottom surface of the semiconductor substrate 202. In some embodiments, the first dielectric layer 110d include a thickness (as measured in the direction Z) approximately in the range of 1 nm to 10 nm, although other suitable thickness may alternatively be utilized.

Figure 4:
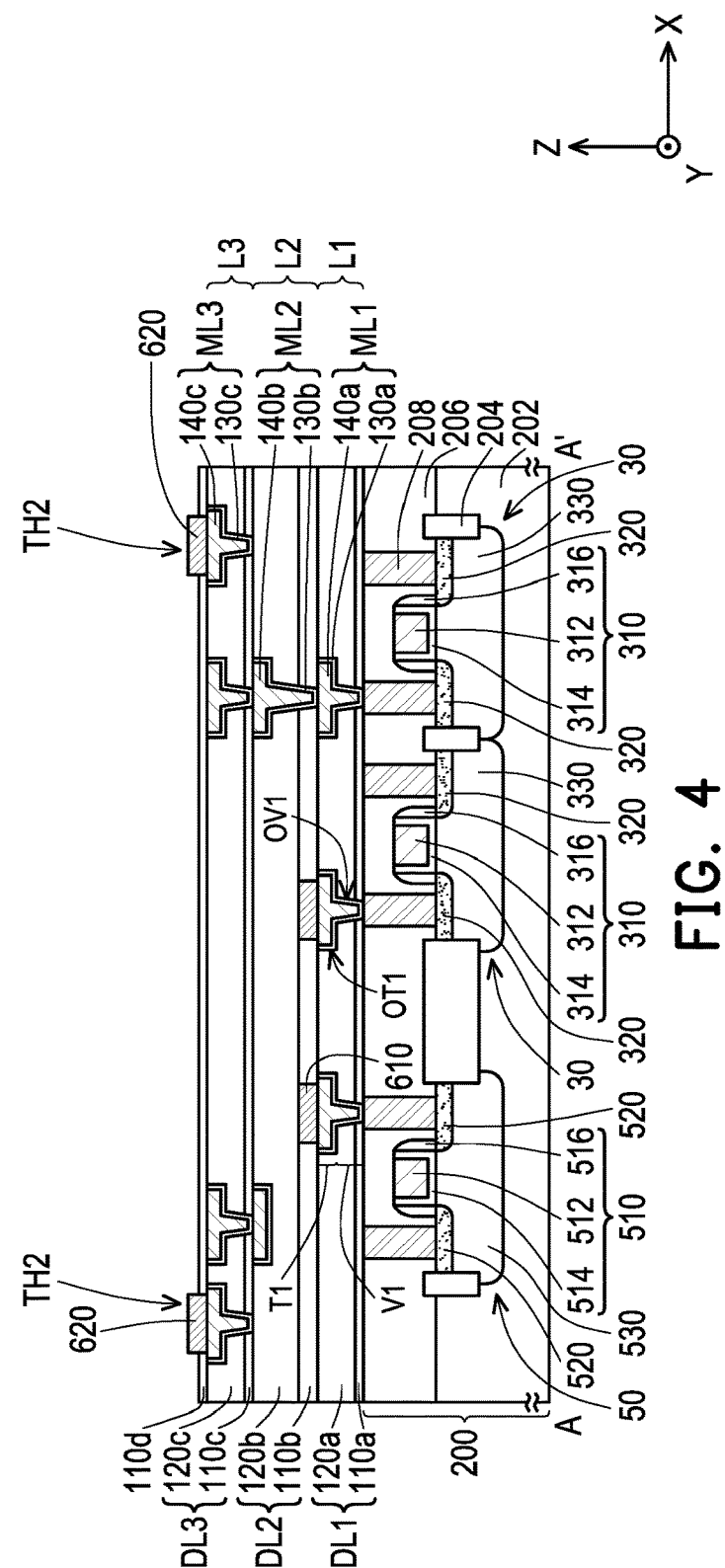

Referring to FIG. 4, in some embodiments, a plurality of second source/drain regions 620 are formed in the first dielectric layer 110d and further extends away from the first dielectric layer 110d. In the case, the through holes TH2 are filled by the second source/drain regions 620. For example, the second source/drain regions 620 penetrate through the first dielectric layer 110d via the through holes TH2 formed in the first dielectric layer 110d so to be in physical contact with and electrically connected to the metallization layer ML3. In the case, the second source/drain regions 620 are electrically coupled to different devices (not shown) formed in the semiconductor substrate 202 through the build-up layers L1-L3 (e.g., the metallization layers ML1-ML3) and some of the conductive plugs 208. That is, the second source/drain regions 620 may be biased by different devices formed in the semiconductor substrate 202.

The formation of the second source/drain regions 620 may include, but not limited to, forming a blanket layer of a conductive material over the first dielectric layer 110d and extending into the through holes TH2; and patterning the conductive material blanket layer to form the second source/drain regions 620. The patterning may include photolithography and etching processes. The etching process may include a dry etching, a wet etching, or a combination thereof. After the patterning process, a cleaning process may be optionally performed, for example to clean and remove the residue generated from the patterning process. However, the disclosure is not limited thereto, and the patterning process may be performed through any other suitable method. In some embodiments, illustrated top surfaces of the second source/drain regions 620 are higher than the illustrate top surface of the first dielectric layer 110d. That is, the illustrated top surfaces of the second source/drain regions 620 are above the illustrate top surface of the first dielectric layer 110d. As shown in FIG. 4, sidewalls of the second source/drain regions 620 are partially covered by the first dielectric layer 110d, for example. That is, the sidewalls of the second source/drain regions 620 are partially revealed by the first dielectric layer 110d.

In alternative embodiments, the illustrated top surfaces of the first source/drain regions 620 are substantially level with the illustrate top surface of the first dielectric layer 110d. That is, the illustrated top surfaces of the first source/drain regions 620 may be substantially coplanar to the illustrate top surface of the first dielectric layer 110d. In such alternative embodiments, the formation of the second source/drain regions 620 may be similar to or substantially identical to the forming process of the first source/drain regions 610 as described in FIG. 2. The disclosure is not limited thereto.

In some embodiments, the second source/drain regions 620 may be a metal, a metal oxide, the metal nitride, and the metal silicide, the disclosure is not limited thereto. The metal, the metal oxide, the metal nitride, and the metal silicide may include a metal element, such as Ti, Ta, W, Mo, Ni, Co, Ru, Au, Ag, Pt, Mn, Cu, Al, other conductive materials with a work function compatible with the substrate material, or combinations thereof. In some embodiments, the second source/drain regions 620 include TiN, TiAl, TiAlN, TaN, NiSi, CoSi, or the like. The material of the second source/drain regions 620 may be the same to the material of the first source/drain regions 610. For example, the second source/drain regions 620 are made of TiN. Alternatively, the material of the second source/drain regions 620 may be different from the material of the first source/drain regions 610. In some embodiments, the second source/drain regions 620 include a thickness (as measured in the direction Z) approximately in the range of 5 nm to 10 nm, although other suitable thickness may alternatively be utilized. The second source/drain regions 620 may be formed using a suitable process such as ALD, CVD, PVD, plating, or combinations thereof. The plating process may include electroplating or electroless plating, or the like. The disclosure is not limited thereto. The thickness of the second source/drain regions 620 may be substantially equal to the thickness of the first source/drain regions 610. Alternatively, the thickness of the second source/drain regions 620 may be less than or greater than the thickness of the first source/drain regions 610.

Figure 5:
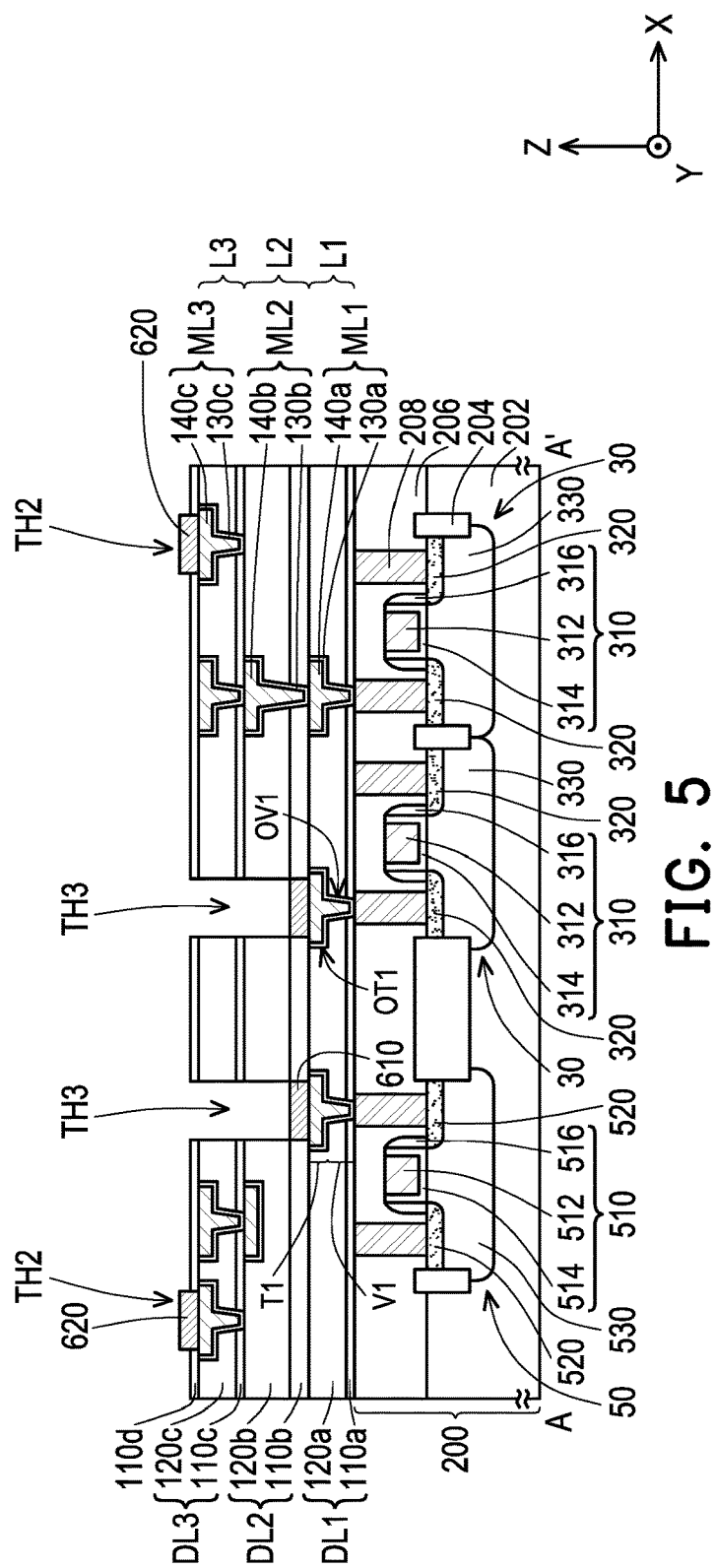

Referring to FIG. 5, in some embodiments, the structure depicted in FIG. 4 is patterned to form a plurality of through holes TH3 exposing the first source/drain regions 610. In some embodiments, the through holes TH3 penetrate through the first dielectric layer 110*d*, the second dielectric layer 120*c*, the first dielectric layer 110*c*, and the second dielectric layer 120*b* to accessibly reveal the first source/drain regions 610. The patterning process may be photolithography and etching processes. The etching process may include a dry etching, a wet etching, or a combination thereof. After the patterning process, a cleaning process may be optionally performed, for example to clean and remove the residue generated from the patterning process. However, the disclosure is not limited thereto, and the patterning process may be performed through any other suitable method. As shown in FIG. 5, a lateral width of the through holes TH3 may be substantially equal to a lateral size of the first source/drain regions 610. However, the disclosure is not limited thereto; alternatively, the lateral width of the through holes TH3 may be less than the lateral size of the first source/drain regions 610. Or alternatively, the lateral width of the through holes TH3 may be greater than the lateral size of the first source/drain regions 610. As shown in FIG. 5, for example, sidewalls of the through holes TH3 are vertical sidewalls. In the case, lateral sizes of the through holes TH3 are substantially constant. However, the disclosure is not limited thereto; alternatively, the sidewalls of the through holes TH3 may be slant sidewalls, where the lateral sizes of the through holes TH3 may be gradually decreased in the direction from the illustrated top surface of the semiconductor substrate 202 toward the illustrated bottom surface of the semiconductor substrate 202.

Figure 6:
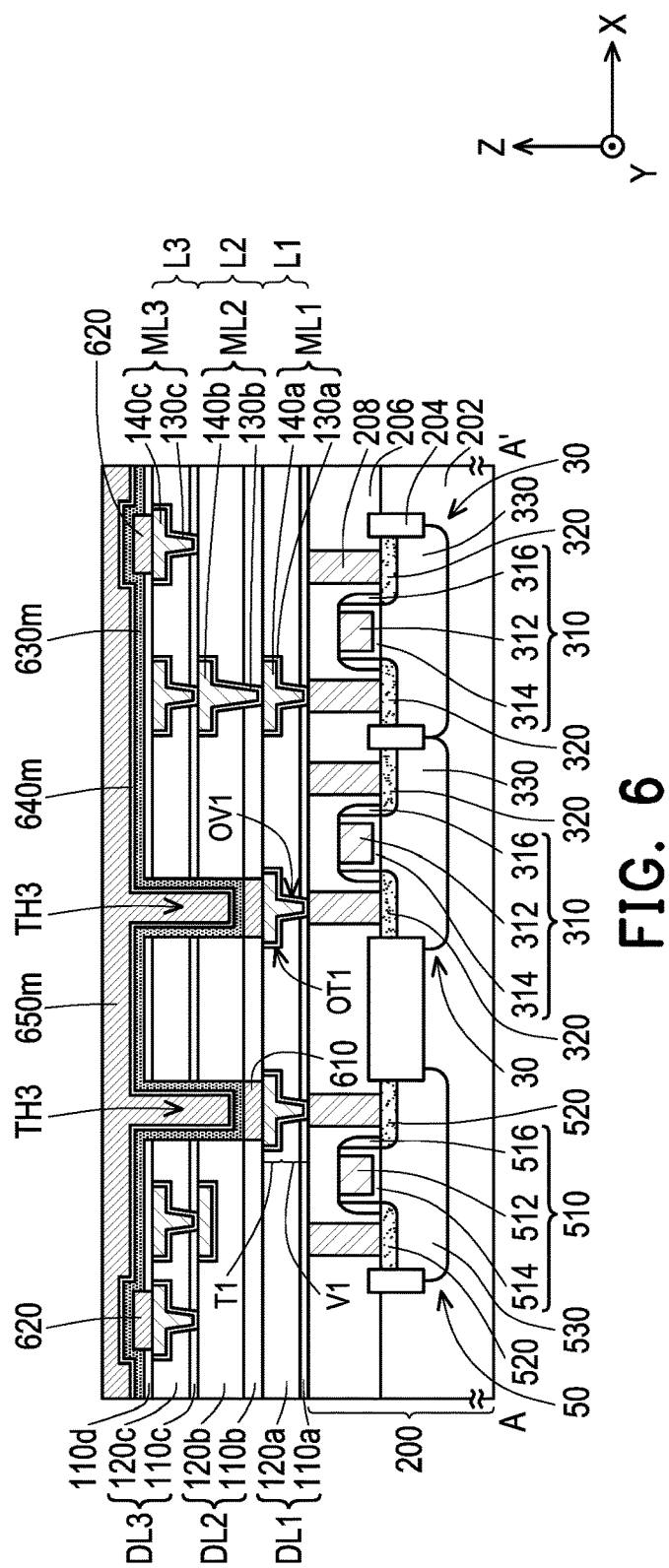

Referring to FIG. 6, in some embodiments, a semiconductor material 630*m*, a gate dielectric material 640*m*, and a gate material 650*m* are sequentially formed over the structure depicted in FIG. 5. As shown in FIG. 6, the semiconductor material 630*m* may be conformally formed over the first dielectric layer 110*d*. For example, the semiconductor material 630*m* further extends into the through holes TH3 so to line at least the through holes TH3. In some embodiments, the semiconductor material 630*m* is disposed on (e.g., in physical contact with) sidewalls and bottom surfaces of the through holes TH3, the illustrated top surfaces of the first source/drain regions 610 exposed by the through holes TH3, the sidewalls and the illustrated top surfaces of the second source/drain regions 620 exposed by the first dielectric layer 110*d*, and the illustrated top surface of the first dielectric layer 110*d*. In the case, sidewalls of the second dielectric layer 120*b*, the first dielectric layer 110*c*, the second dielectric layer 120*c*, and the first dielectric layer 110*d* accessibly revealed at the sidewalls of the through holes TH3 are in (physical) contact with the semiconductor material 630*m*. In some embodiments, the semiconductor material 630*m* include a thickness approximately in the range of 5 nm to 10 nm, although other suitable thickness may alternatively be utilized. For example, the semiconductor material 630*m* includes a metal oxide, which is formed by CVD or the like. Examples of metal oxides used for semiconductor materials include oxides of In, Ga, Zn, Al, Sn, Ni, and/or mixtures thereof. For example, the semiconductor material 630*m* are made of indium gallium zinc oxide (IGZO).

Thereafter, the gate dielectric material 640*m* may be conformally formed over the semiconductor material 630*m*, as shown in FIG. 6. For example, the gate dielectric material 640*m* further extends into the through holes TH3 to cover the semiconductor material 630*m*. In some embodiments, the gate dielectric material 640*m* is disposed on (e.g., in physical contact with) an illustrated top surface of the semiconductor material 630*m*. In other words, the gate dielectric material 640*m* may at least line the semiconductor material 630*m* inside the through holes TH3. In some embodiments, the gate dielectric material 640*m* include a thickness approximately in the range of 5 nm to 10 nm, although other suitable thickness may alternatively be utilized. The gate dielectric material 640*m* may include silicon oxide, silicon nitride, silicon oxy-nitride, or high-k dielectric materials. In some embodiments, the high-k dielectric materials include metal oxides, metal nitrides, or metal carbides. Examples of metal oxides, metal nitrides, or metal carbides used for high-k dielectric materials include oxides, nitrides, and/or carbides of Hf, Zr, Li, Al, Ta, Ti, La, Be, Mg, Ca, Sr, Sc, Y, Ce, Pr, Nd, Sm, Eu, Gd, Tb, Dy, Ho, Er, Tm, Yb, Lu, and/or mixtures thereof. For example, the gate dielectric material 640*m* are made of HfO. The gate dielectric material 640*m* may be formed using a suitable process such as ALD, CVD, PVD, thermal oxidation, UV-ozone oxidation, or combinations thereof. The disclosure is not limited thereto.

After the formation of the gate dielectric material 640*m*, the gate material 650*m* may formed over the gate dielectric material 640*m*, as shown in FIG. 6. For example, the gate material 650*m* further extends into the through holes TH3 to cover the gate dielectric material 640*m* and fills the through holes TH3. In some embodiments, the gate material 650*m* is disposed on (e.g., in physical contact with) an illustrated top surface of the gate dielectric material 640*m*. In other words, the gate material 650*m* may at least line the gate dielectric material 640*m* inside the through holes TH3.

In some embodiments, the gate material 650*m* may be a metal, a metal oxide, the metal nitride, and the metal silicide, the disclosure is not limited thereto. The metal, the metal oxide, the metal nitride, and the metal silicide may include a metal element, such as Ti, Ta, W, Mo, Ni, Co, Ru, Au, Ag, Pt, Mn, Cu, Al, other conductive materials with a work function compatible with the substrate material, or combinations thereof. In some embodiments, the gate material 650m include TiN, TiAl, TiAlN, TaN, NiSi, CoSi, or the like. For example, the gate material 650m are made of TiN. The gate material 650m may be formed using a suitable process such as ALD, CVD, PVD, plating, or combinations thereof. The plating process may include electroplating or electroless plating, or the like. The disclosure is not limited thereto; alternatively, the gate dielectric material 640m may be a poly gate consisting of a silicon-containing material, such as poly-silicon, amorphous silicon or a combination thereof.

Figure 7:
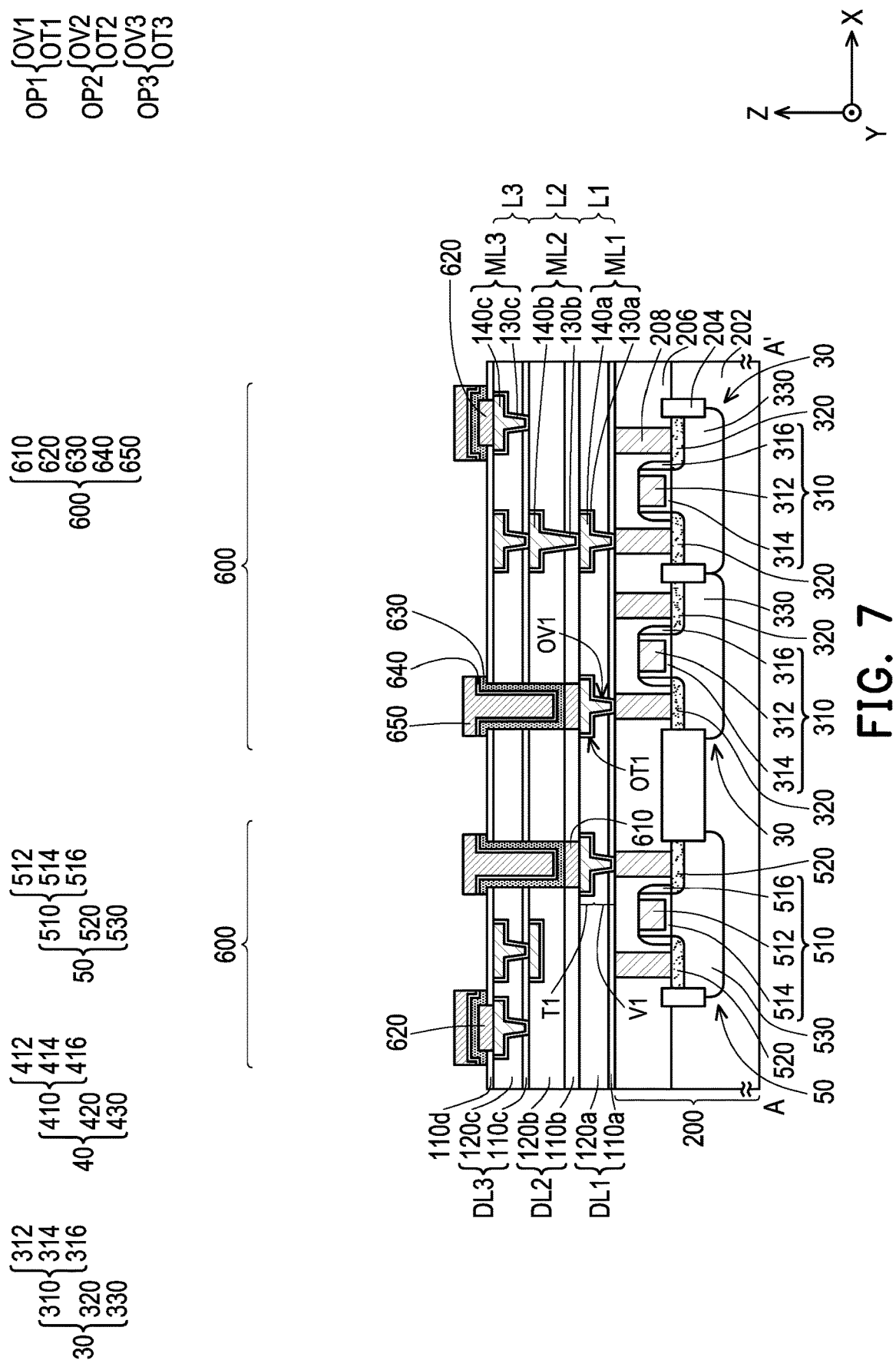

Referring to FIG. 7, in some embodiments, the gate material 650m, the gate dielectric material 640m, and the semiconductor material 630m are patterned to form a plurality of gate electrodes 650, a plurality of gate dielectric patterns 640, and a plurality of semiconductor patterns 630 over the first source/drain regions 610 and the second source/drain regions 620. The patterning may include photolithography and etching processes. The etching process may include a dry etching, a wet etching, or a combination thereof. After the patterning process, a cleaning step may be optionally performed, for example to clean and remove the residue generated from the patterning process. However, the disclosure is not limited thereto, and the patterning process may be performed through any other suitable method. Up to here, a plurality of thin film transistors (TFTs) 600 are manufactured. The TFTs 600 may be referred to as vertical TFTs.

As shown in FIG. 7 and FIG. 12, for example, one gate dielectric pattern 640 is deposed between (e.g., sandwiched between) a respective one gate electrode 650 and a respective one semiconductor pattern 630, where a side (e.g., an illustrated bottom surface) of the semiconductor pattern 630 is in (e.g., physical) contact with the respective one first source/drain region 610 and the respective one second source/drain region 620. As shown in FIG. 12, for example, the gate dielectric pattern 640, the respective one gate electrode 650, and the respective one semiconductor pattern 630 extend from a respective one first source/drain region 610 to a respective one second source/drain region 620, where the gate dielectric pattern 640, the respective one gate electrode 650, and the respective one semiconductor pattern 630 have the same contour in a vertical projection on the substrate 200 in the direction Z (e.g., a X-Y plane view of FIG. 12). In some embodiments, the gate electrodes 650 are electrically coupled to different devices (of which one of the different devices includes the transistor 30) formed in the semiconductor substrate 202 through the build-up layers L1-L4 (e.g., the metallization layer ML1-ML4 depicted in FIG. 8 to FIG. 11) and some of the conductive plugs 208. That is, the gate electrodes 650 may be biased by different devices formed in the semiconductor substrate 202.

In some embodiments, each of the TFTs 600 includes one first source/drain region 610, one second source/drain region 620, one semiconductor pattern 630, one gate dielectric pattern 640, and one gate electrode 650. In the case, the first and second source/drain regions 610 and 620 stand at the same side of the semiconductor pattern 630, the gate dielectric pattern 640 and the gate electrode 650 stand at the same side of the semiconductor pattern 630 opposing to the first and second source/drain regions 610 and 620, and the gate dielectric pattern 640 is sandwiched between the semiconductor pattern 630 and the gate electrode 650. For example, as shown in FIG. 12, the semiconductor pattern 630, the gate dielectric pattern 640, and the gate electrode 650 overlap with and extend between the first and second source/drain regions 610 and 620. In some embodiments, the TFTs 600 are separated from one another. In some embodiments, structures and configurations of the TFTs 600 are substantially identical to each other. Owing to the semiconductor patterns 630, the TFTs 600 may be considered as low-temperature TFTs, which is able to be formed in the BEOL process. Owing to the formation and configurations of the TFTs 600, the manufacturing process of the semiconductor device 1A is simplified, thereby lowering the manufacturing cost.

In some embodiments, for each TFT 600, the gate electrode 650 and the gate dielectric pattern 640 are together referred to as a gate structure of each TFT 600, where the gate electrode 650 is referred to as a gate, the first and second source/drain regions 610 and 620 are referred to as a source/drain element of each TFT 600, and a portion of the semiconductor pattern 630 sandwiched between the first and second source/drain regions 610 and 620 is referred to as a channel or a channel region of each TFT 600. It is appreciated that a conduction status of the channel or the channel region is controlled by a voltage applied or induced onto the gate electrode 650. In the case, the conduction status of the channel or the channel region can be detected and/or controlled by the devices formed in the semiconductor substrate 202. The gate electrodes 650 may be together referred to as a gate electrode layer or a patterned conductive layer. The gate dielectric patterns 640 may be together referred to as a gate dielectric layer or a patterned dielectric layer. The semiconductor patterns 630 may be together referred to as a semiconductor layer or a patterned semiconductor layer. The first source/drain regions 610 may be together referred to as a first source/drain layer or a patterned conductive layer. The second source/drain regions 620 may be together referred to as a second source/drain layer or a patterned conductive layer. It is appreciated that the first source/drain regions 610, the second source/drain regions 620, and the gate electrodes 650 are electrically coupled to (e.g., to be biased by) different devices formed in the semiconductor substrate 202.

Figure 8:
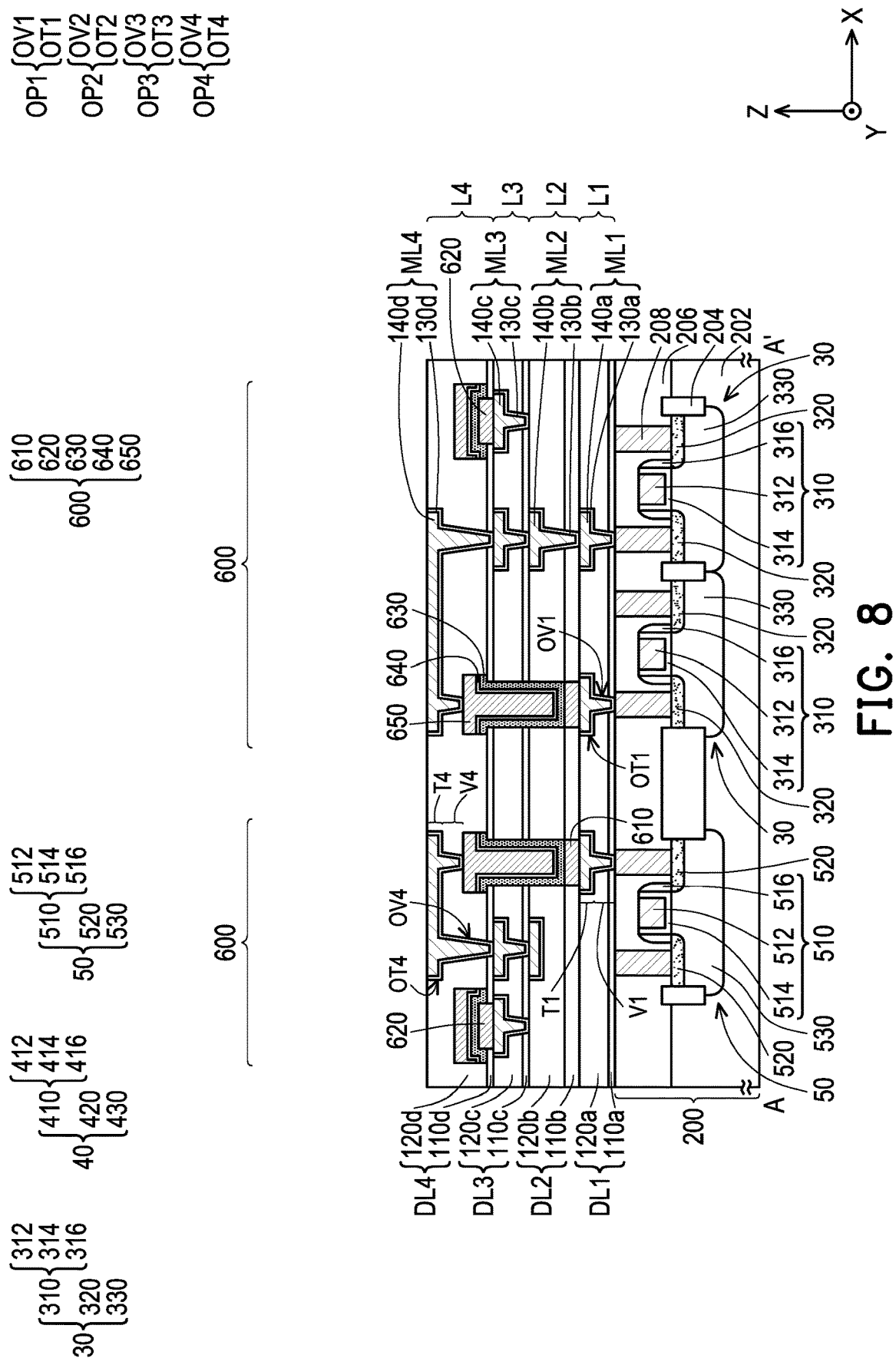

Referring to FIG. 8, in some embodiments, a second dielectric layer 120d, a seed layer 130d, and a conductive layer 140d are formed over the structure depicted in FIG. 7 to form the build-up layer L4 over the build-up layer L3. As shown in FIG. 8, for example, the build-up layer L4 is disposed on (e.g., in physical contact with) and electrically connected to the build-up layer L3, and thus is electrically coupled to the devices formed in the semiconductor substrate 202 through some of the contact plugs 208 and the build-up layers L1-L3 for providing routing function thereto. In some embodiments, the build-up layer L3 is sandwiched between the build-up layer L2 and the build-up layer L4. The build-up layers L1 through L4 are electrically coupled to each other. The build-up layer L4 may be referred to as a fourth build-up layer L4. The formation, material, and configuration of components of each of the build-up layer L4 are similar to or substantially identical to the forming process, material, and configuration of the components of the build-up layer L1 as aforementioned above, and thus are not repeated herein for brevity. As illustrated in FIG. 8, the gate electrodes of the TFTs 600 may be electrically coupled to and electrically communicated to the different devices formed in the semiconductor substrate 202 through the build-up layers L1-L4 and at least one of the conductive plugs 208.

In some embodiments, the build-up layer L4 includes a dielectric structure DL4 and a metallization layer ML4 disposed therein. The dielectric structure DL4 may include the first dielectric layer 110d and the second dielectric layer 120d disposed thereon, where the dielectric structure DL4 may be penetrated by a plurality of opening OP4. In the case, the metallization layer ML4 is disposed inside the openings OP4, where the metallization layer ML4 includes the seed layer 130d and the conductive layer 140d disposed thereon, the seed layer 130d lines sidewalls of the openings OP4, and the conductive layer 140d directly stacked on the seed layer 130d. The conductive layer 140d of the metallization layer ML4 is electrically coupled to the conductive layer 140c of the metallization layer ML3 through the seed layer 130d, for example, as shown in FIG. 8. The openings OP4 each may include a trench hole OT4 and a via hole OV4 underlying and spatially communicated to the trench hole OT4. For example, the trench holes OT4 are formed in the second dielectric layer 120d and extend from an illustrated top surface of the second dielectric layer 120d to a position inside the second dielectric layer 120d. For example, the via holes OV4 are formed in the second dielectric layer 120d and the first dielectric layer 110d and extend from the position inside the second dielectric layer 120d to an illustrated bottom surface of the first dielectric layer 110d. The position may be about ½ to about ⅓ of a thickness of the second dielectric layer 120d; however, the disclosure is not limited thereto. As illustrated in FIG. 8, portions of the metallization layer ML4 formed in the trench holes OT4 may be referred to as conductive traces or conductive wires T4 horizontally extended (e.g., extending in the direction X and/or the direction Y), and portions of the metallization layer ML4 formed in the via holes OV4 may be referred to as conductive vias V4 vertically extended (e.g., extending in the direction Z). In the case, an illustrated top surface of the metallization layer ML4 is substantially level with an illustrated top surface of the dielectric structure DL4. That is, the illustrated top surface of the metallization layer ML4 is substantially coplanar to the illustrated top surface of the dielectric structure DL4. In addition, the build-up layers L1, L2, L3, and L4 may be referred to as redistribution layers or routing layers of the interconnect 100 (in FIG. 12).

The configurations and modifications of the openings OP1 and the metallization layer ML1 of the build-up layer L1 as described in FIG. 1 may also applied to (e.g., adopted by) the openings OP4 and the metallization layer ML4 of the build-up layer L4. The disclosure is not limited thereto.

Figure 9:
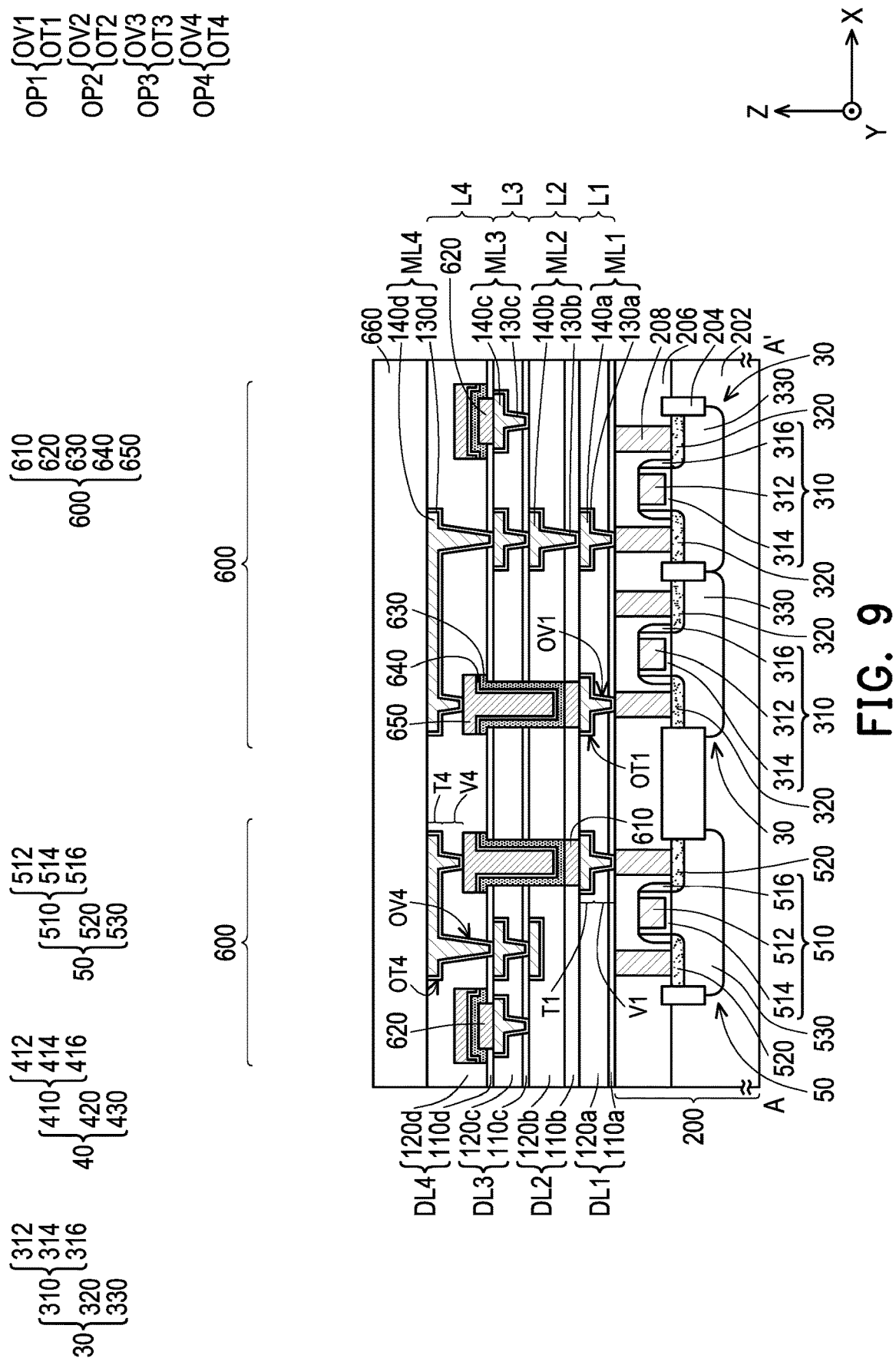

Referring to FIG. 9, in some embodiments, a dielectric layer 660 is formed over the structure depicted in FIG. 8 to cover the build-up layer L4. The dielectric layer 660 may be referred to as a passivation layer or a protection layer. The formation of the dielectric layer 660 may include, but not limited to, conformally forming a blanket layer of a dielectric material over the structure depicted in FIG. 8. The material of the dielectric layer 660 is or include, for example, silicon oxide, silicon nitride, silicon oxynitride, a spin-on dielectric material, or a low-k dielectric material. For example, the low-k dielectric material generally has a dielectric constant lower than 3.9. The dielectric material may be formed by CVD such as HDP-CVD and SACVD or formed by spin-on. The patterning may include photolithography and etching processes. The etching process includes a dry etching, a wet etching, or a combination thereof, for example. The dielectric layer 660 may have a thickness (as measured in the direction Z) of about 400 nm to about 5000 nm, although other suitable thickness may alternatively be utilized. An illustrated top surface of the dielectric layer 660 may have a high degree of coplanarity so to facilitate the formation of a later-formed layer or component.

Figure 10:
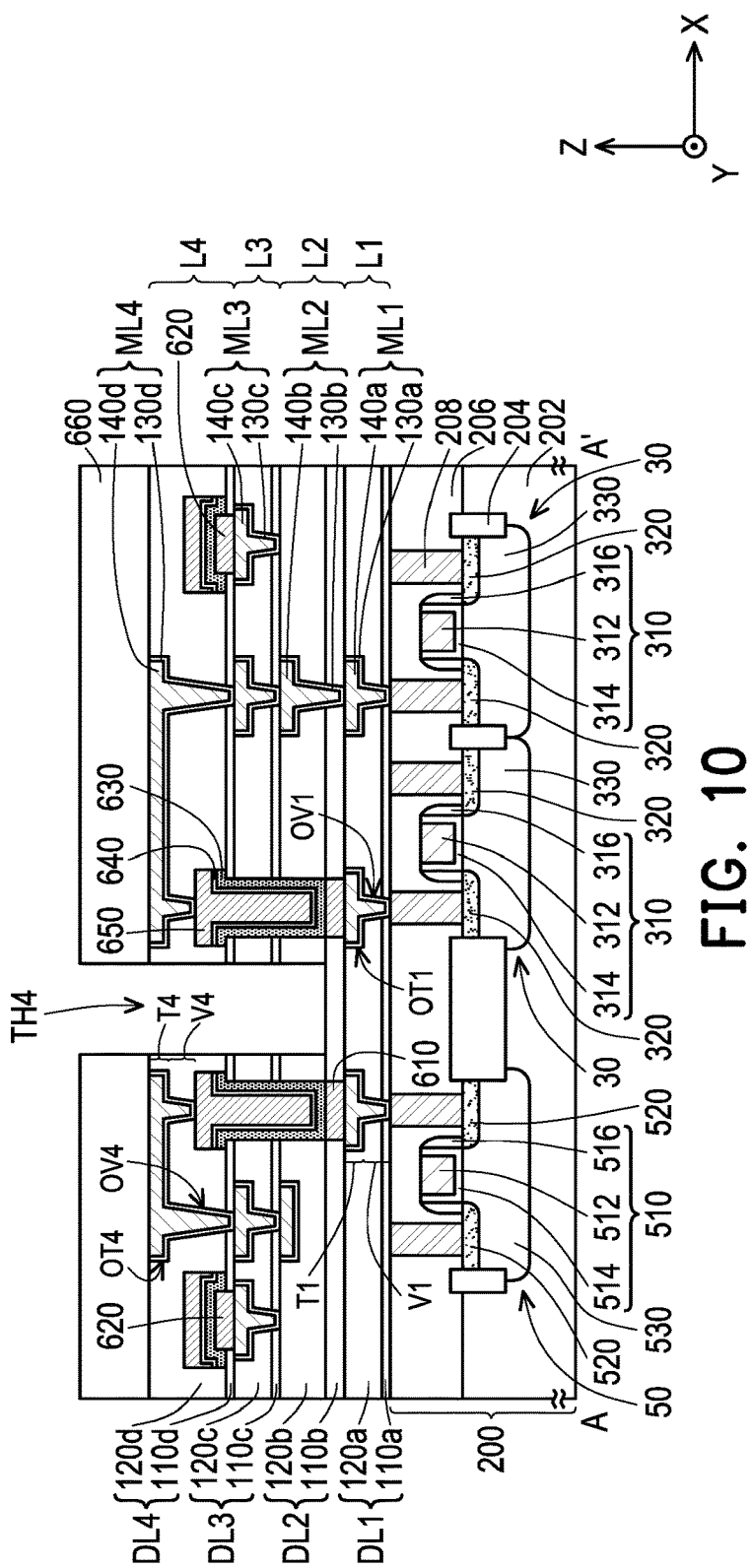

Referring to FIG. 9 and FIG. 10 together, in some embodiments, the dielectric layer 660 is patterned to form a through hole TH4 disposed between the TFTs 600 (also see FIG. 12). In FIG. 10, the through hole TH4 may include one through hole TH4 for illustrative purposes, only; the disclosure is not limited thereto. In alternative embodiments, the through hole TH4 includes a plurality of through holes TH4. For example, as shown in FIG. 10, the through hole TH4 penetrates through the dielectric layer 660, the second dielectric layer 120d, the first dielectric layer 110d, the second dielectric layer 120c, the first dielectric layer 110c, and the second dielectric layer 120b and accessibly reveals a portion of the illustrated top surface of the first dielectric layer 110b. The patterning may include photolithography and etching processes. The etching process includes a dry etching, a wet etching, or a combination thereof, for example. After the patterning process, a cleaning process may be optionally performed, for example to clean and remove the residue generated from the patterning process. However, the disclosure is not limited thereto, and the patterning process may be performed through any other suitable method. In some embodiments, an aspect ratio of the through hole TH4 is ranging about 1.2 to about 100. Here, the aspect ratio of the through hole TH4 is a ratio of a width (a shortest distance between two opposite sidewalls in a cross-section) to a height (a shortest distance between a top opening to a bottom opening in a cross-section) of the through hole TH4.

As illustrated in FIG. 10, in some embodiments, the sidewall of the through hole TH4 is a vertical sidewall, where a lateral size of the through hole TH4 is substantially constant. However, the disclosure is not limited thereto; alternatively, a sidewall of the through hole TH4 may a slant sidewall, where the lateral size of the through hole TH4 may be gradually decreased in the direction from the illustrated top surface of the semiconductor substrate 202 toward the illustrated bottom surface of the semiconductor substrate 202. In some embodiments, if considering the plane view (e.g., the X-Y plane), a cross-section of the through hole TH4 is in a rectangular shape, as shown in FIG. 12. However, the disclosure is not limited thereto; alternatively, in the plane view, the cross-section of the through hole TH4 may be in a circular shape, an oval shape, an elliptical shape, a hexagonal shape, an octangular shape, any other suitable polygonal shape, or an annulus shape, depending on the demand and design requirements. In addition, the annulus shape may be circular, oval, elliptical, rectangular, hexagonal, octangular, or any other suitable polygonal. As shown in FIG. 12, the TFTs 600 are separated from each other through the through hole TH4, for example.

Figure 11:
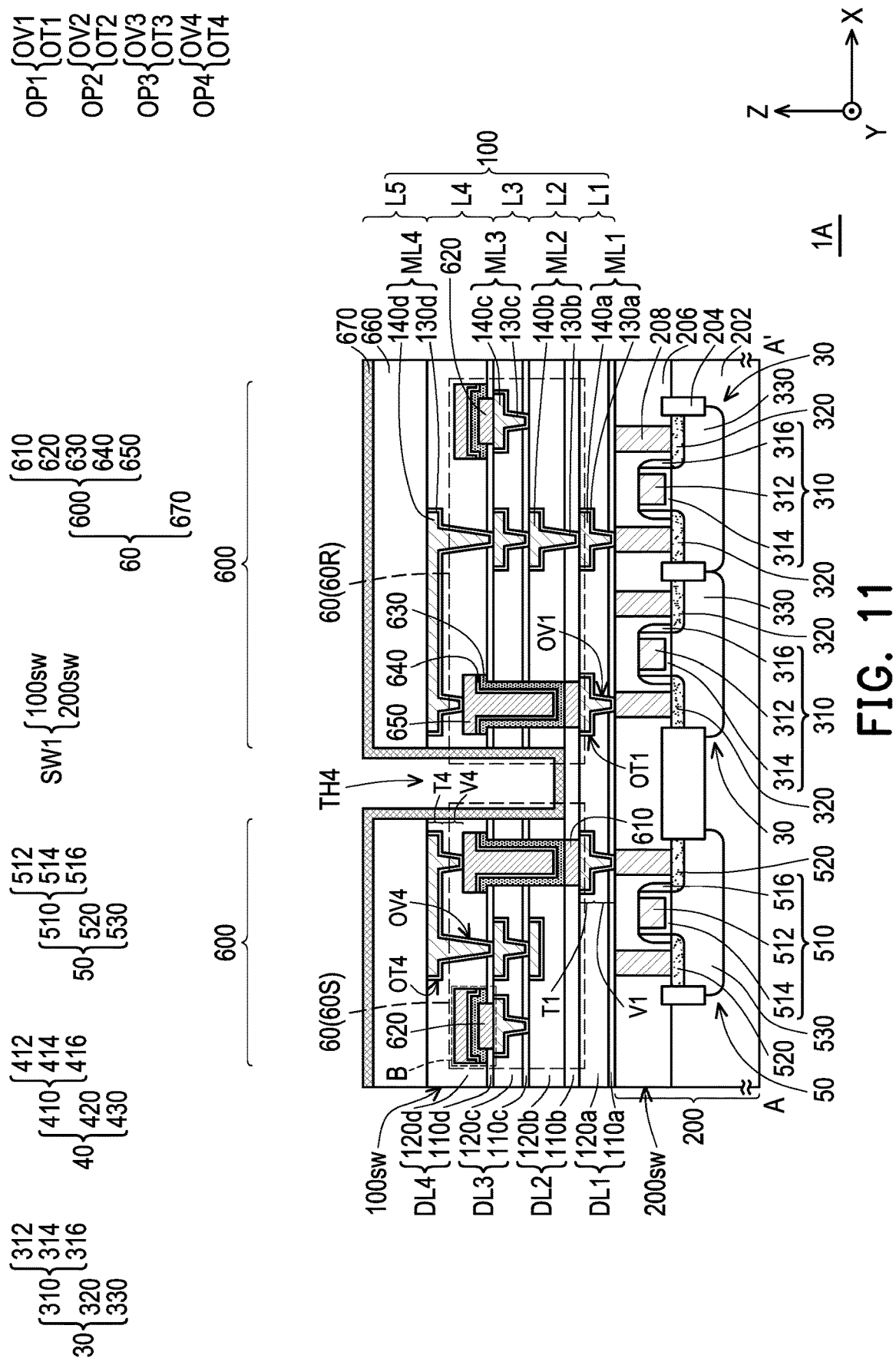

Referring to FIG. 11, in some embodiments, a sensing layer 670 is conformally formed on the dielectric layer 660 and further extends into the through hole TH4. For example, the sensing layer 670 is disposed on (e.g., in physical contact with) the dielectric layer 660 and further extends into the through hole TH4 so to line sidewalls and a bottom surface of the through hole TH4. In the case, an illustrated top surface of the dielectric layer 660, sidewalls of the dielectric layer 660, the second dielectric layer 120d, the first dielectric layer 110d, the second dielectric layer 120c, the first dielectric layer 110c, and the second dielectric layer 120b accessibly revealed at the sidewalls of the through hole TH4, and the portion of the illustrated top surface of the first dielectric layer 110b accessibly revealed at the bottom surface of the through hole TH4 are in (physical) contact with the sensing layer 670. In the case, the sensing layer 670 is at least partially overlapped with the semiconductor patterns 630 of different transistors 600, inside the through hole TH4.

In some embodiments, the sensing layer 670 reacts with or binds directly to a target in a fluid. In alternative embodiments, the sensing layer 670 reacts with or binds indirectly to a target in a fluid through sensing probes (not shown) posited on the sensing layer 670. In some embodiments, the sensing layer 670 is or include hafnium oxide, tantalum oxide, zirconium oxide, some other suitable high-k dielectric(s), or any combination of the foregoing. For example, the sensing layer 670 is sensitive to a pH of a fluid and hence reacts to a pH of the fluid to change a surface potential difference at the sensing layer 670. In the case, the sensing layer 670 is or includes hafnium oxide and/or some other suitable sensing material(s). In some embodiments, the sensing layer 670 is referred to as a bio-sensing layer or bio-sensing film. The sensing layer 670 may have a thickness of about 1 nm to about 100 nm, although other suitable thickness may alternatively be utilized. Up to here, a plurality of sensor components 60 are manufactured. In some embodiments, the sensor components 60 each include one transistor 600 and a portion of the sensing layer 670 disposed at the sidewall of the through hole TH4 and overlapped with the semiconductor pattern 630 included in the one transistor 600.

In some embodiments, the sensor components 60 may include one or more than one sensor TFT 60S and one or more than one reference TFT 60R. It is appreciated that, at least one sensor TFT 60S and at least one reference TFT 60R together are referred to as a sensor or sensor device included in a semiconductor device of the disclosure. That is, after the formation of the sensor or sensor device, the semiconductor device 1A is manufactured. It is appreciated that, structures and configurations of the sensor TFT 60S and the reference TFT 60R are substantially identical to each other. As shown in FIG. 11, a sidewall 100sw of the interconnect 100 and a sidewall 200sw of the substrate 200 may together confine a sidewall SW1 of the semiconductor device 1A.

In some embodiments, the semiconductor device 1A includes the substrate 200 and the interconnect 100 disposed thereon, where the sensor components 60 are embedded inside the interconnect 100. As illustrated in FIG. 11, for example, a layer with the dielectric layer 660 and the sensing layer 670 formed therein constitutes a build-up layer L5 of the interconnect 100. In the case, the interconnect 110 includes the build-up layers L1 through L5. In the case, the build-up layer L5 is referred to as a topmost tier/level/layer of the interconnect 100, and the build-up layer L1 is referred to as a bottommost tier/level/layer of the interconnect 100. That is, the sensor components 60 are posited under the topmost layer of the interconnect 100. The interconnect 100 may be referred to as an interconnect structure, a redistribution structure, or a routing structure, sometimes.

In some embodiments, the sensing layer 670 is configured to react with or otherwise bind to a target to change a surface potential difference of the sensing layer 670 of the sensor TFT 60S. The change in the surface potential difference of the sensing layer 670 of the sensor TFT 60S changes a threshold voltage of the sensor TFT 60S, which may be used to characterize and/or identify the target. For example, a fluid containing the target may be biased by the reference TFT 60R to induce formation of a channel in the semiconductor pattern 630 of the sensor TFT 60S, and the target may be characterized and/or identified by an impedance of the induced channel in the sensor TFT 60S.

For example, as shown in FIG. 11 and FIG. 14, during use of the sensor or sensor device, a fluid 800 is placed on the sensing layer 670. As shown in FIG. 14, the fluid 800 may include a plurality of positive ions and a plurality of negative ions, where the positive ions may be considered as a target 802. In the case, the second source/drain region 620 of the reference TFT 60R is biased at a drain voltage Vrd (e.g., about 1.0 V), the first source/drain region 610 of the reference TFT 60R is biased at a source voltage Vrs (e.g., about 1.0 V), and the gate electrode 650 of the reference TFT 60R is biased at a gate voltage Vrg (e.g., about 1.0 V), while the second source/drain region 620 of the sensor TFT 60S is biased at a drain voltage Vrd (e.g., about 0.5 V), the first source/drain region 610 of the sensor TFT 60S is biased at a source voltage Vrs (e.g., about 0 V), and the gate electrode 610 of the sensor TFT 60S is biased at a gate voltage Vsg (e.g., about 0 V). With such, the fluid 800 is biased to induce formation of a channel in the semiconductor pattern 630 of the sensor TFT 60S by having the target 802 (e.g., the positive ions) being repelled from the reference TFT 60R and accumulating on the illustrated outermost surface of the sensing layer 670 (disposed at the sidewall of the through hole TH4) of the sensor TFT 60S and having the negative ions being repelled from the sensor TFT60S and accumulating on the illustrated outermost surface of the sensing layer 670 (disposed at the sidewall of the through hole TH4) of the reference TFT 60R. The biasing causes a channel (not shown) to form (or induced) in the semiconductor pattern 630 (e.g., the channel region) of the sensor TFT 60S and the threshold voltage variations from the target 802 cause variations in an impedance of the channel of the sensor TFT 60S. Hence, the impedance of the channel and/or drain current through the channel in the sensor TFT 60S may be measured to characterize and/or identify the target 802.

However, the disclosure is not limited thereto. For another example, as shown in FIG. 11 and FIG. 15, during use of the sensor or sensor device, a fluid 800 is placed on the sensing layer 670. As shown in FIG. 15, the fluid 800 may include a plurality of positive ions and a plurality of negative ions, where the negative ions may be considered as a target 802. In the case, the second source/drain region 620 of the reference TFT 60R is biased at a drain voltage Vrd (e.g., about −1.0 V), the first source/drain region 610 of the reference TFT 60R is biased at a source voltage Vrs (e.g., about −1.0 V), and the gate electrode 650 of the reference TFT 60R is biased at a gate voltage Vrg (e.g., about −1.0 V), while the second source/drain region 620 of the sensor TFT 60S is biased at a drain voltage Vrd (e.g., about −0.5 V), the first source/drain region 610 of the sensor TFT 60S is biased at a source voltage Vrs (e.g., about 0 V), and the gate electrode 610 of the sensor TFT 60S is biased at a gate voltage Vsg (e.g., about 0 V). With such, the fluid 800 is biased to induce formation of a channel in the semiconductor pattern 630 of the sensor TFT 60S by having the target 802 (e.g., the negative ions) being repelled from the reference TFT 60R and accumulating on the illustrated outermost surface of the sensing layer 670 (disposed at the sidewall of the through hole TH4) of the sensor TFT 60S and having the positive ions being repelled from the sensor TFT60S and accumulating on the illustrated outermost surface of the sensing layer 670 (disposed at the sidewall of the through hole TH4) of the reference TFT 60R. The biasing causes a channel (not shown) to form (or induced) in the semiconductor pattern 630 (e.g., the channel region) of the sensor TFT 60S and the threshold voltage variations from the target 802 cause variations in an impedance of the channel of the sensor TFT 60S. Hence, the impedance of the channel and/or drain current through the channel in the sensor TFT 60S may be measured to characterize and/or identify the target 802.

In other words, the target 802 may react with and/or bind to the sensing layer 670 of the sensor TFT 60S to change a surface potential difference at the sensing layer 670 of the sensor TFT 60S. The change in the surface potential difference at the sensing layer 670 of the sensor TFT 60S may change a threshold voltage of the sensor TFT 60S, which may be used to characterize and/or identify the target 802. In some embodiments, the target 802 is or includes ions, see FIG. 14 and FIG. 15, however the disclosure is not limited thereto. Alternatively, the target 802 may be or include nucleic acids, polarized molecules, antigens, antibodies, enzymes, cells, some other suitable target(s), or any combination thereof. It is appreciated that each sensor component 60 (such as 60S and 60R depending on the demand and/or desired need) formed in the interconnect is biased/controlled/detected by different devices formed in the semiconductor substrate 202.

In addition, the through hole TH4 may be referred to as a sensing region of the interconnect 100. That is, a size of the sensing region of a sensor or sensor device may be controlled (e.g., increase or decrease) by adjusting a number of the build-up layers being penetrated by the through holes TH3 and the shape and/or size of the through holes TH3 and/or TH4, so to change an occupying area of the sensing layer 670 overlapped with a semiconductor pattern 630 of a respective one TFT 600 inside the through hole TH4. Owing to such configuration, a sensing area of the semiconductor device 1A is greatly increased without increasing an overall area thereof, thereby achieving a small form factor.

In alternative embodiments, the build-up layer L1 may be omitted, where the first source/drain regions 610 and the metallization layer L2 may be disposed on (e.g., in physical contact with) and electrically coupled to the conductive plugs 208. In such alternative embodiments, an overall thickness of the semiconductor device 1A can be further reduced.

Figure 16:
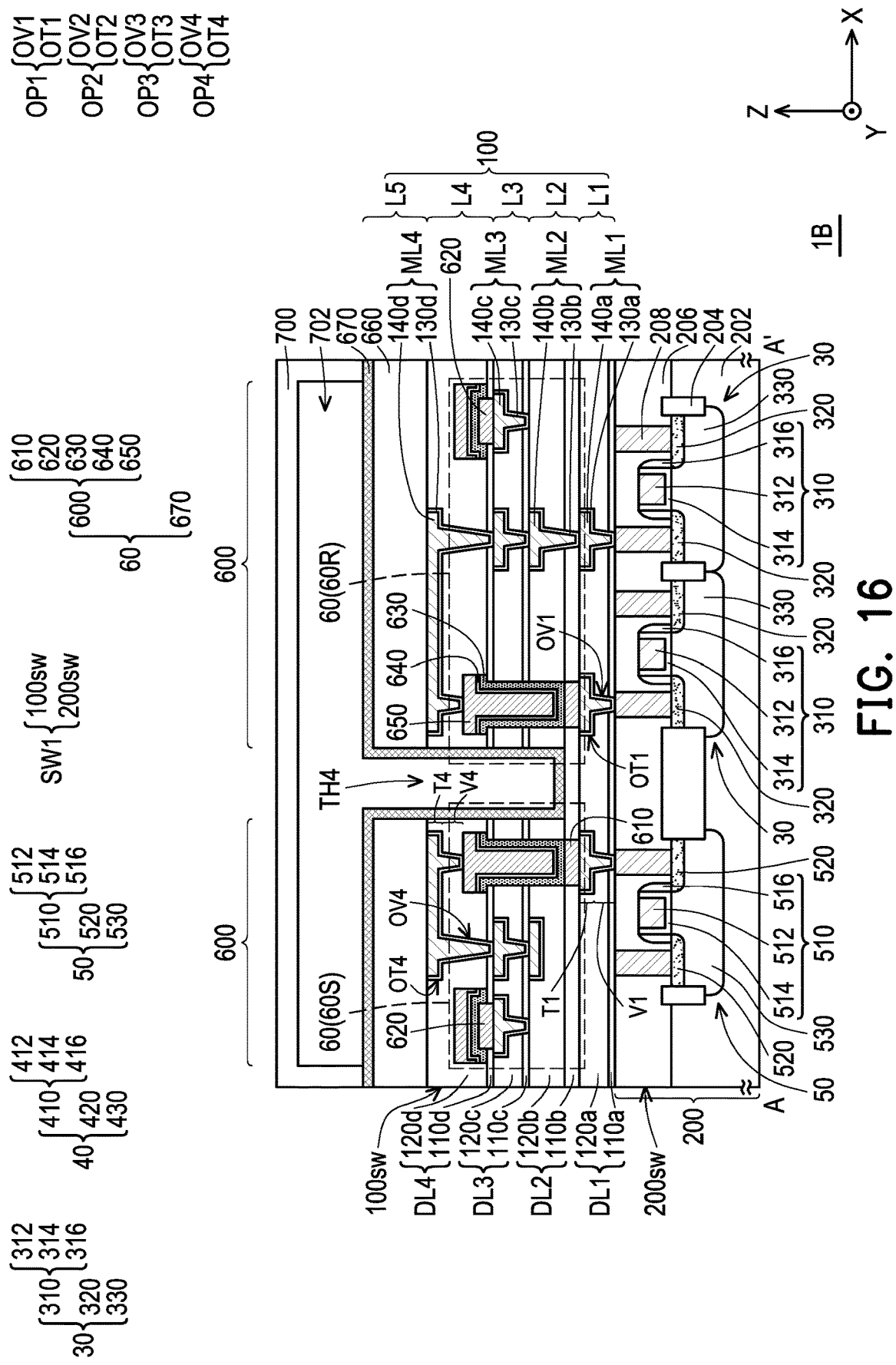
FIG. 16 is a schematic cross-sectional view of a semiconductor device in accordance with some alternative embodiments of the disclosure.

The semiconductor device may further be equipped with a cap. FIG. 16 is a schematic cross-sectional view of a semiconductor device 1B in accordance with some embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIG. 16, in some embodiments, the semiconductor device 1B is manufactured by providing a cap 700 and mounting the cap 700 onto the interconnect 100, following the process as described in FIG. 11. The cap 700 may include one or more than one opening for the fluid (800 in FIG. 14 and FIG. 15) to be in and out of the semiconductor device 1B for testing. The cap 700 may include a plurality of microchannels (not shown) formed therein. In some embodiments, the microchannels are or include micro fluid channels, which is capable of providing functionality of filtering, fluid guiding, solution mixing, heating, cooling, etc.; the disclosure is not limited thereto. The cap 700 may be made of a dielectric material, such as Polydimethylsiloxane (PDMS) or the like. In some embodiments, the cap 700 is mounted on the interconnect 100, where the interconnect 100 is disposed between the cap 700 and the substrate 200. For example, as shown in FIG. 16, the cap 700 includes a recess 702, where the recess 702 is overlying and spatially communicated to the through hole TH4. In such case, the recess 702 and the through hole TH4 together confine an accommodating space (or a cavity) for the fluid 800 inside the semiconductor device 1B. The mounting process may include thermal bonding, soldering bonding, or the like.

Figure 17:
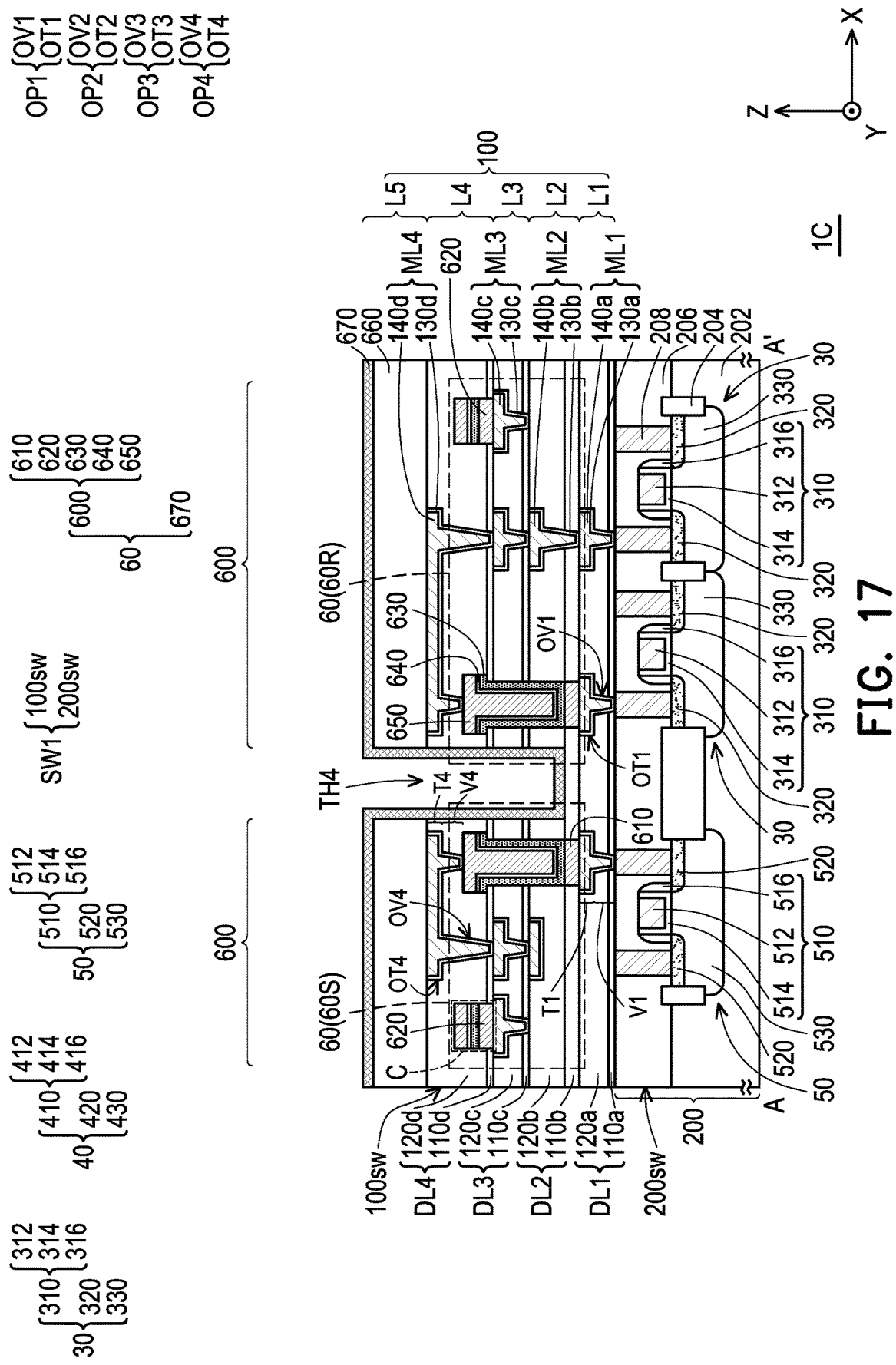
FIG. 17 is a schematic cross-sectional view of a semiconductor device in accordance with some alternative embodiments of the disclosure.
Figure 18:
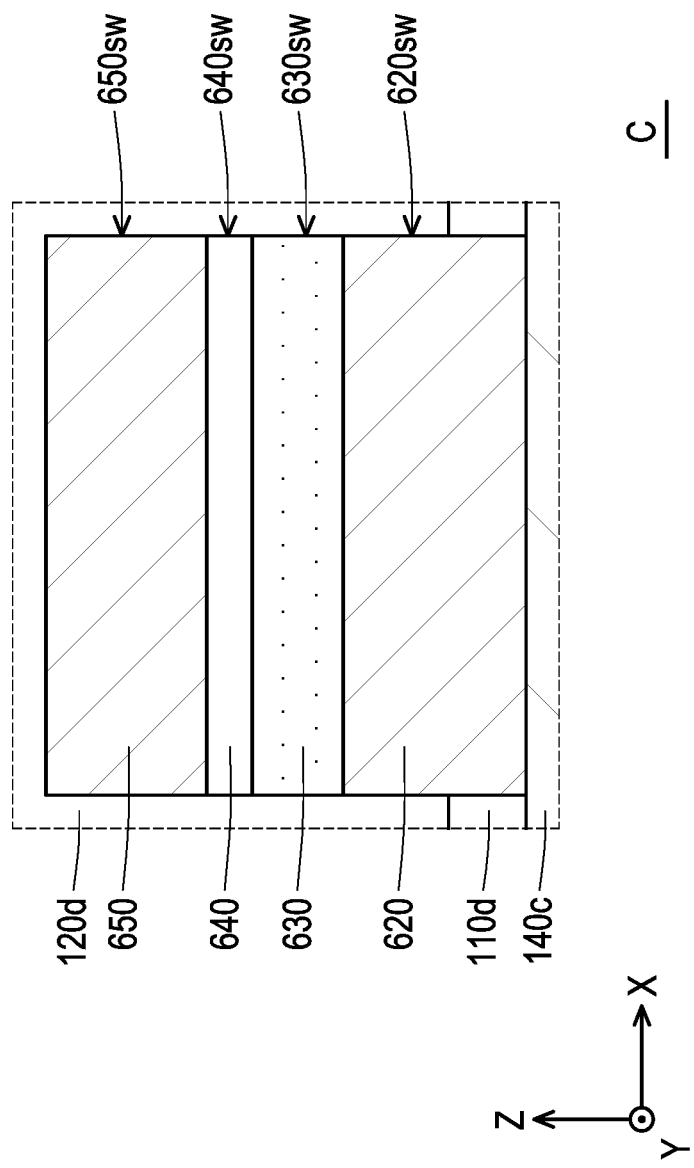
FIG. 18 is an enlarged and schematic cross-sectional view showing a part of internal components of a semiconductor device in accordance with some alternative embodiments of the disclosure.

In some embodiments, for each TFT 600 included in the semiconductor device 1A, a sidewall 640sw of the gate dielectric pattern 640, a sidewall 650sw of the respective one gate electrode 650, and a sidewall 630sw of the respective one semiconductor pattern 630 are substantially aligned, as shown in the cross-section depicted in FIG. 13. In the case, a sidewall 620sw of a respective one second source/drain region 620 exposed by the first dielectric layer 110d is covered by the respective one semiconductor pattern 630, as shown in FIG. 11 and FIG. 13. However, the disclosure is not limited thereto. FIG. 17 is a schematic cross-sectional view of a semiconductor device 1C in accordance with some embodiments of the disclosure. FIG. 18 is an enlarged and schematic cross-sectional view showing a part of internal components of the semiconductor device 1C in accordance with some alternative embodiments of the disclosure, where the enlarged and schematic cross-sectional view of FIG. 18 is outlined in a dash-box C of FIG. 17. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. In some embodiments, for each TFT 600 included in the semiconductor device 1C, a sidewall 640sw of the gate dielectric pattern 640, a sidewall 650sw of the respective one gate electrode 650, a sidewall 630sw of the respective one semiconductor pattern 630, and a sidewall 620sw of a respective one second source/drain region 620 exposed by the first dielectric layer 110d are substantially aligned, as shown in the cross-section depicted in FIG. 17 and FIG. 18. In the case, a sidewall 620sw of the respective one second source/drain region 620 exposed by the first dielectric layer 110d is covered by the second dielectric layer 120d.

In alternative embodiment, a cap 700 may be adopted by the semiconductor device 1C, where the interconnect 100 is disposed between the cap 700 and the substrate 200. The details (e.g., the material, configuration or the like) of the cap 700 have been previously described in FIG. 16, and thus are not repeated herein.

Figure 19:
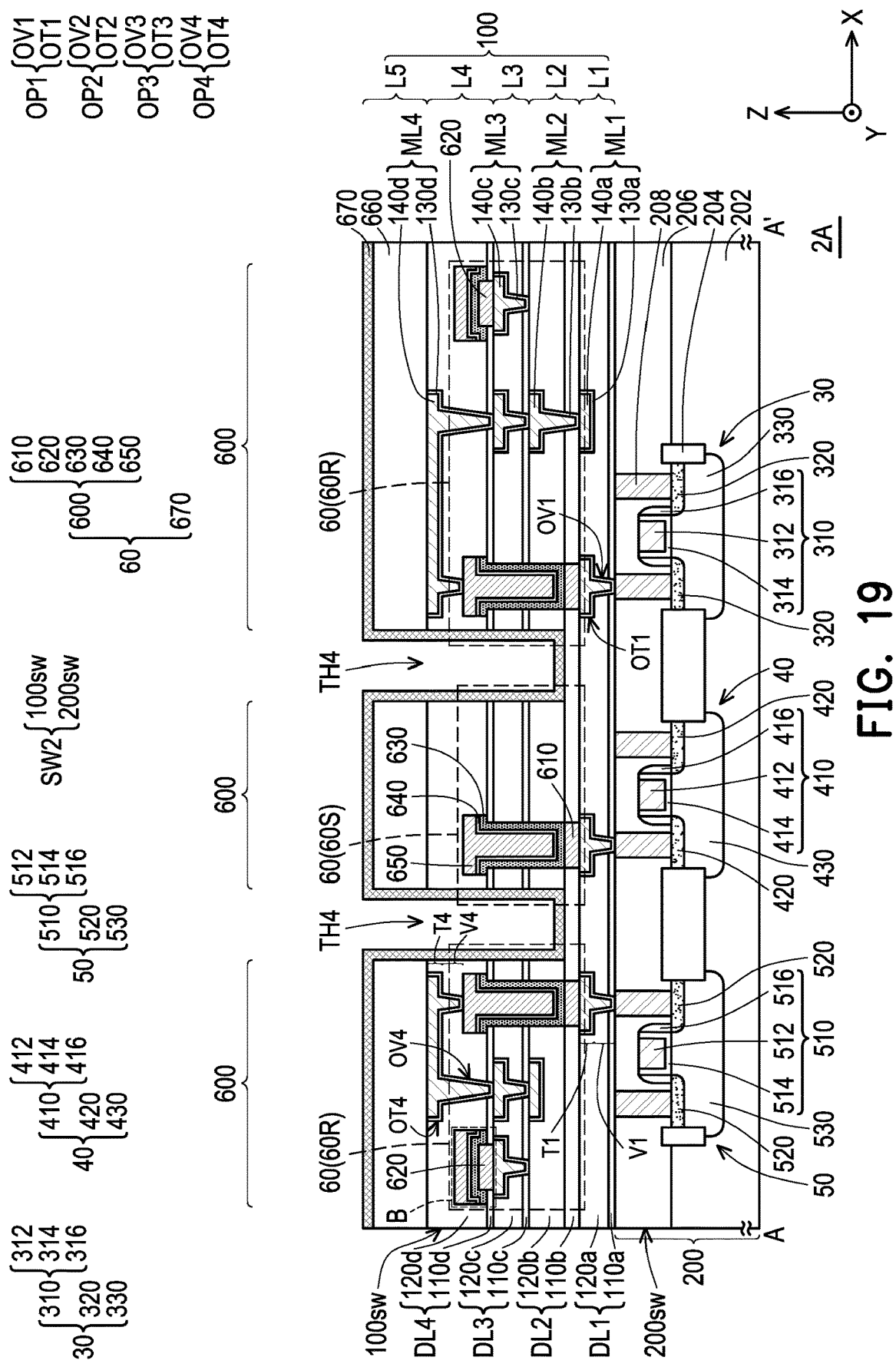
FIG. 19 is a schematic cross-sectional view of a semiconductor device in accordance with some embodiments of the disclosure.
Figure 20:
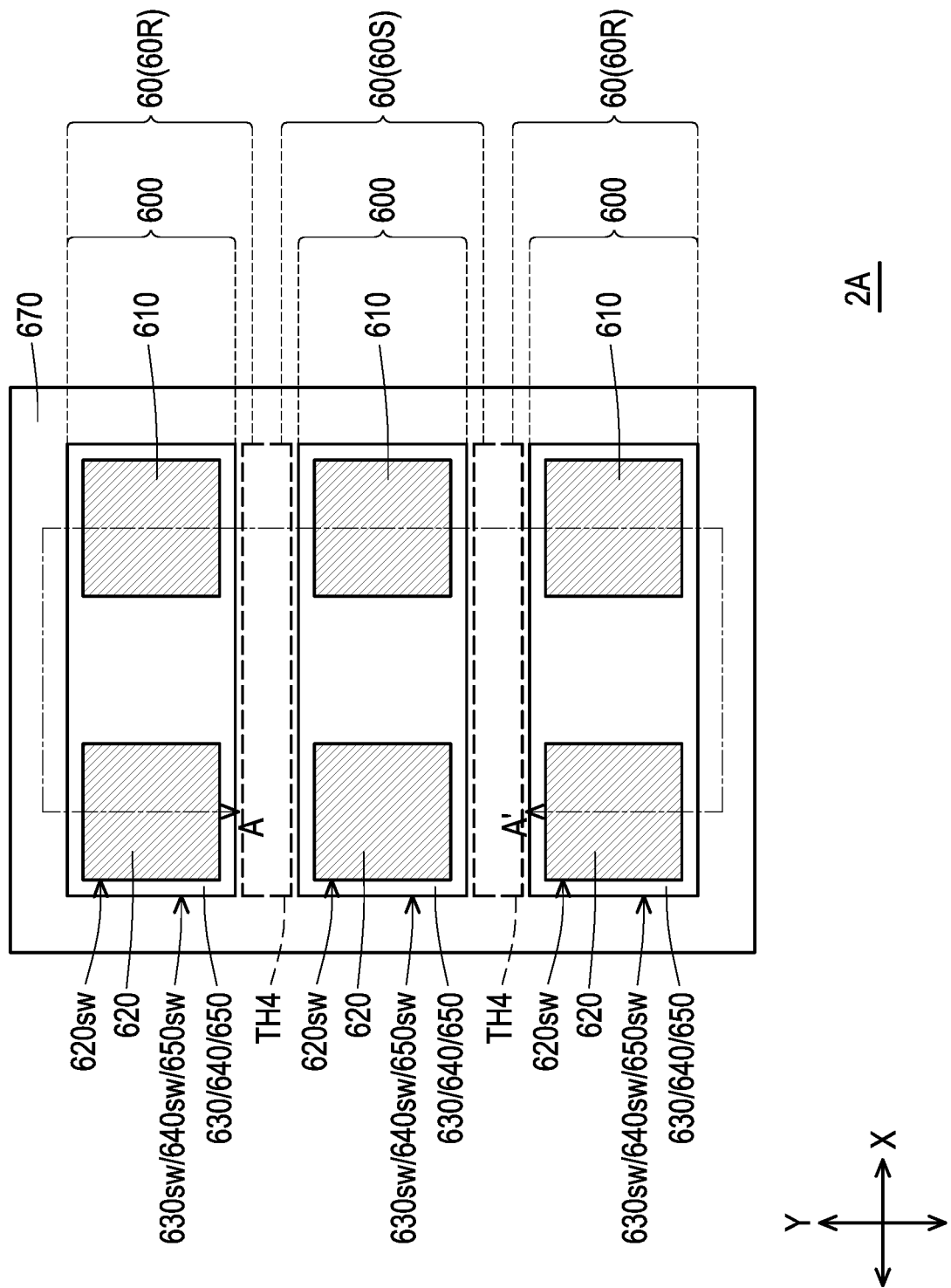
FIG. 20 is a schematic plane view illustrating a relative position between internal components of a semiconductor device in accordance with some embodiments of the disclosure.
Figure 21:
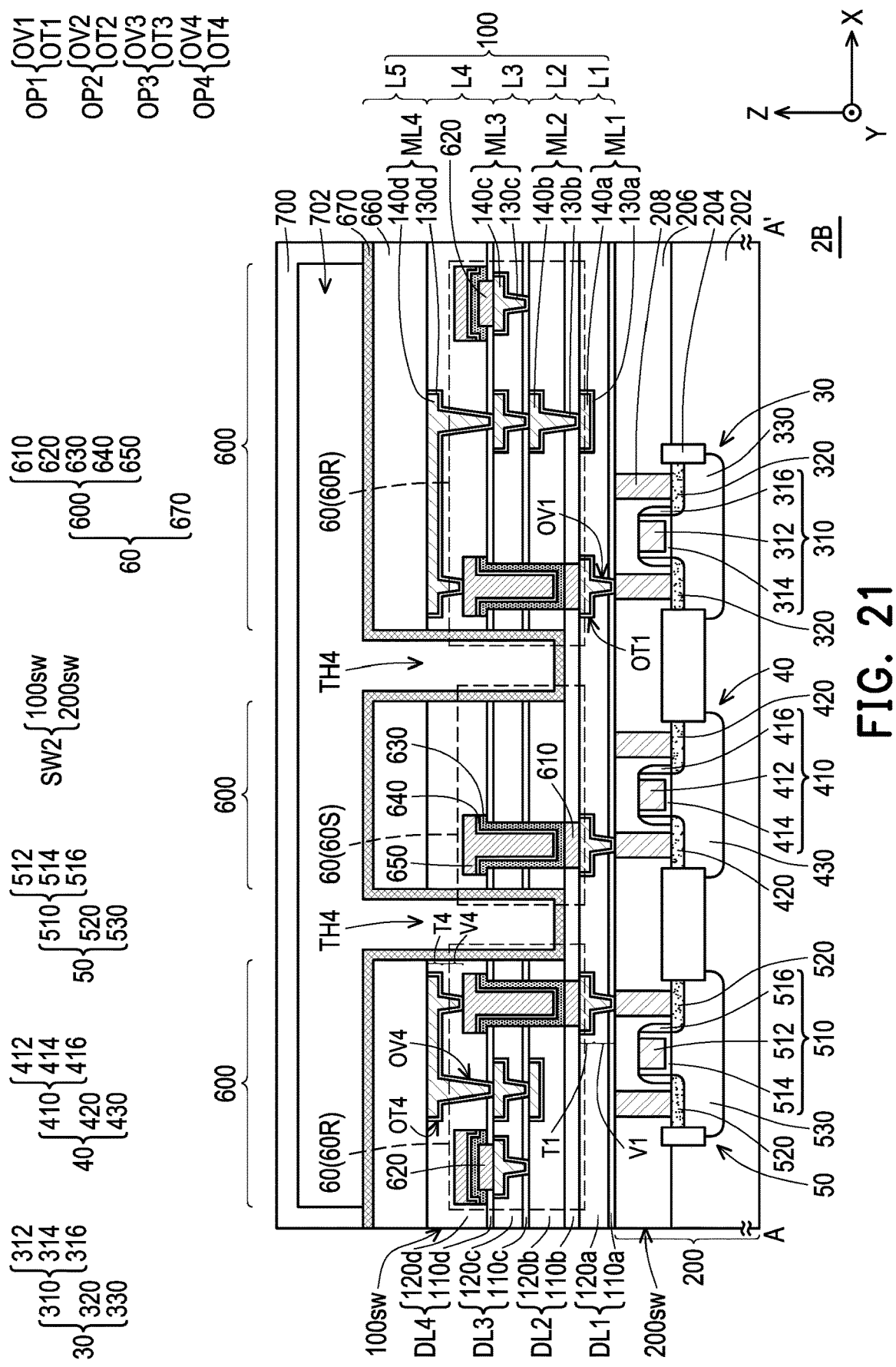
FIG. 21 is a schematic cross-sectional view of a semiconductor device in accordance with some alternative embodiments of the disclosure.
Figure 22:
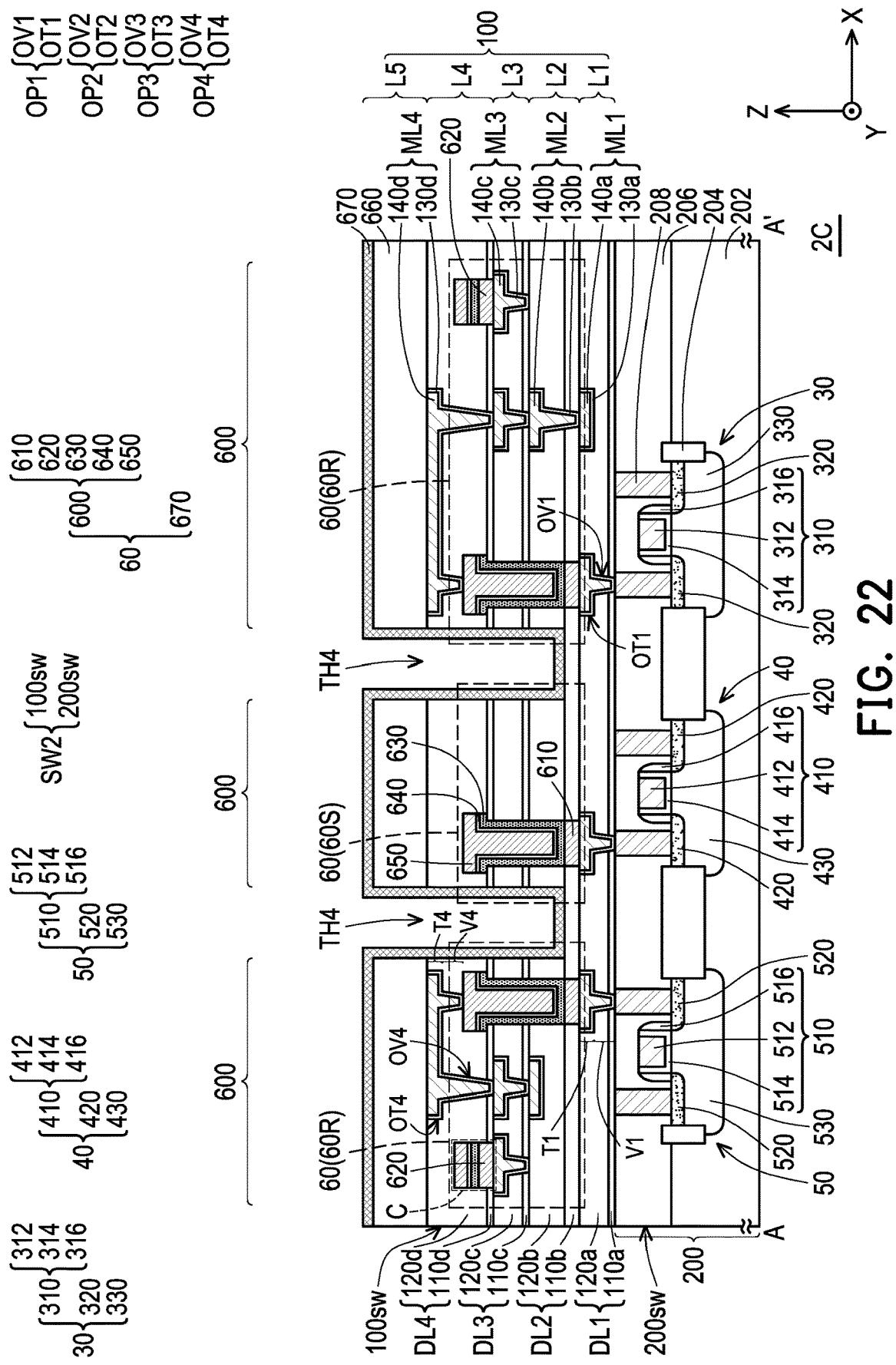
FIG. 22 is a schematic cross-sectional view of a semiconductor device in accordance with some alternative embodiments of the disclosure.

In some embodiments of the semiconductor device 1A depicted in FIG. 11 and FIG. 12, there is only one sensor TFT60S and one reference TFT60R. However, the disclosure is not limited thereto; alternatively, one or more than one sensor TFT 60S and one or more than one reference TFT 60R may be presented in one semiconductor device. FIG. 19 is a schematic cross-sectional view of a semiconductor device 2A in accordance with some embodiments of the disclosure. FIG. 20 is a schematic plane view illustrating a relative position between internal components of the semiconductor device 2A in accordance with some embodiments of the disclosure, where the schematic cross-sectional view of FIG. 19 is taken along a line A-A' depicted in FIG. 20. FIG. 21 is a schematic cross-sectional view of a semiconductor device 2B in accordance with some alternative embodiments of the disclosure. FIG. 22 is a schematic cross-sectional view of a semiconductor device 2C in accordance with some alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Referring to FIG. 19 and FIG. 20, in some embodiments, the semiconductor device 2A includes a substrate 200, an interconnect 100 disposed on the substrate 200, and a plurality of sensor components 60 embedded in the interconnect 100. As shown in FIG. 19, a sidewall 100sw of the interconnect 100 and a sidewall 200sw of the substrate 200 may together confine a sidewall SW2 of the semiconductor device 2A. For example, the sensor components 60 includes one sensor TFTs 60S and two reference TFTs 60R, where the sensor TFTs 60S and the reference TFTs 60R are arranged along a line. As shown in FIG. 19 and FIG. 20, the reference TFTs 60R may be laterally disposed at two opposite sides of the sensor TFTs 60S. In the case, the sensor TFT 60S is disposed between the reference TFTs 60R. It is appreciated that, at least one sensor TFT 60S and at least one reference TFT 60R together are referred to as a sensor or sensor device included in a semiconductor device of the disclosure. For example, as illustrated in FIG. 20, an upper reference TFT 60R and the sensor TFT 60S constitute a first sensor or sensor device of the semiconductor device 2A, and a lower reference TFT 60R and the sensor TFT 60S constitute a second sensor or sensor device of the semiconductor device 2A. In other words, the sensor TFT 60S may be considered as a sensor TFT 60S of dual-side sensing areas. For a non-limiting example, the first and second sensor or sensor devices of the semiconductor device 2A work together as a whole during the operation. However, the disclosure is not limited thereto; in certain embodiments, an upper reference TFT 60R and the sensor TFT 60S constitute a first sensor or sensor device of the semiconductor device 2A, and a lower reference TFT 60R and the sensor TFT 60S constitute a second sensor or sensor device of the semiconductor device 2A, where the first sensor or sensor device of the semiconductor device 2A and the second sensor or sensor device of the semiconductor device 2A may work at different time frame and/or sensing different targets based on the demand and design requirements. The details of the substrate 200, the interconnect 100, the TFTs 600, and the sensor components 60 have previously described in FIG. 1 through FIG. 11 in conjunction with FIG. 14 and FIG. 15, and thus are not repeated herein. As shown in FIG. 20, two adjacent ones of the TFTs 600 are separated from each other through one of the through holes TH4, for example.

Referring to FIG. 21, in some embodiments, a semiconductor device 2B is similar to the semiconductor device 2A of FIG. 19; that is, the structures, materials, and functions of the semiconductor device 2B are similar to those of the semiconductor device 2A, and thus the details are omitted herein. The main difference between the semiconductor device 2B and the semiconductor device 2A lies in that the semiconductor device 2B further includes a cap 700 mounted on the interconnect 100, where the interconnect 100 is disposed between the cap 700 and the substrate 200. The details (e.g., the material, configuration or the like) of the cap 700 have been described in FIG. 16, and thus are not repeated herein.

Referring to FIG. 22, in some embodiments, a semiconductor device 2C is similar to the semiconductor device 2A of FIG. 19; that is, the structures, materials, and functions of the semiconductor device 2C are similar to those of the semiconductor device 2A, and thus the details are omitted herein. The main difference between the semiconductor device 2C and the semiconductor device 2A lies in that, in each TFT 600, the sidewalls 620sw of the second source/drain regions 620 of the semiconductor device 2C is substantially aligned the sidewall 640sw of the gate dielectric pattern 640, the sidewall 650sw of the respective one gate electrode 650, and the sidewall 630sw of the respective one semiconductor pattern 630. The details (e.g., the material, configuration or the like) of such configuration have been previously described in FIG. 18, and thus are not repeated herein for brevity.

In some alternative embodiments, the semiconductor devices 1A, 1B, 1C, 2A, 2B, 2C, and their modifications independently are referred to as a semiconductor die, a semiconductor chip, a semiconductor integrated circuit (IC), or the like. On the other hand, for example, the sensor TFTs 60S independently are referred to as a sensing element or a vertical (sensing) transistor while the reference TFTs 60R independently are referred to as a reference element or a vertical (reference) transistor. The disclosure is not limited thereto. A number of sensor or sensor device being independently or dependently operated with one another may be one or multiple, the disclosure is not limited thereto. In embodiments of the multiple sensors or sensor devices are employed, the types and/or arrangement of the sensor components of the multiple sensors or sensor devices may be different, in part or all. Or, in embodiments of the multiple sensors or sensor devices are employed, the types and/or arrangement of the sensor components of the multiple sensor or sensor device may be substantially identical to one another. The number of the sensors or sensor devices included in one semiconductor device may be selected and designed based on the demand and design requirements. In the disclosure, positioning locations of the sensor TFT(s) 60S and the reference TFT(s) 60R are interchangeable. The disclosure is not limited thereto.

In accordance with some embodiments, a semiconductor device includes a substrate, an interconnect, a second transistor, and a sensing film. The substrate includes devices disposed therein. The interconnect is disposed on the substrate and electrically coupled to the devices, where the interconnect includes a plurality of build-up layers and a through hole formed therein. The first transistor is disposed in the interconnect and vertically extends through at least one of the plurality of build-up layers, and the first transistor is electrically coupled to a first device of the devices through the interconnect. The second transistor is disposed in the interconnect and vertically extends through the at least one of the plurality of build-up layers, and the second transistor is electrically coupled to a second device of the devices through the interconnect, where the first transistor and the second transistor are laterally separated from one another through the through hole. The sensing film is disposed on the interconnect and further extends into the through hole, where the sensing film is laterally disposed between the first transistor and the second transistor.

In accordance with some embodiments, a semiconductor device includes a substrate, an interconnect, and a sensor device. The substrate includes a plurality of devices. The interconnect is disposed on the substrate and electrically coupled to the plurality of devices, and has a first region and a second region surrounding the first region, where a first thickness of the first region is less than a second thickness of the second region. The sensor device is disposed on the substrate and electrically coupled to the plurality of devices through the interconnect, and includes a first sensing element and a first reference element. The first sensing element includes a first sensing transistor disposed in the second region and electrically coupled to the plurality of devices and a first sensing layer disposed in the first region and laterally overlapped with the first sensing transistor. The first reference element includes a first reference transistor disposed in the second region and electrically coupled to the plurality of devices and a second sensing layer disposed in the first region and laterally overlapped with the first reference transistor. In a plane view of the semiconductor device, the first region is posited between and laterally separates the first sensing element and the first reference element, and the first sensing layer and the second sensing layer are disposed at opposite sides of the first region.

In accordance with some embodiments, a method of manufacturing a semiconductor device includes the following steps: providing a substrate comprising devices therein; disposing an interconnect on the substrate, the interconnect being electrically coupled to the devices and comprising a plurality of build-up layers; forming a first transistor in the interconnect, the first transistor vertically extending through at least one of the plurality of build-up layers, and the first transistor being electrically coupled to a first device of the devices through the interconnect; forming a second transistor in the interconnect, the second transistor vertically extending through the at least one of the plurality of build-up layers, the second transistor being electrically coupled to a second device of the devices through the interconnect; patterning the interconnect to form a through hole, the first transistor and the second transistor being laterally separated from one another through the through hole; and disposing a sensing film on the interconnect, the sensing film further extending into the through hole, wherein the sensing film is laterally disposed between the first transistor and the second transistor.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
a substrate, comprising devices disposed therein;
an interconnect, disposed on the substrate and electrically coupled to the devices, wherein the interconnect comprises a plurality of build-up layers and a through hole formed therein;
a first transistor, disposed in the interconnect and vertically extending through at least one of the plurality of build-up layers, the first transistor being electrically coupled to a first device of the devices through the interconnect;
a second transistor, disposed in the interconnect and vertically extending through the at least one of the plurality of build-up layers, the second transistor being electrically coupled to a second device of the devices through the interconnect, wherein the first transistor and the second transistor are laterally separated from one another through the through hole; and
a sensing film, disposed on the interconnect and further extending into the through hole, wherein the sensing film is laterally disposed between the first transistor and the second transistor.

2. The semiconductor device of claim 1, wherein a structure of the first transistor is substantially identical to a structure of the second transistor.

3. The semiconductor device of claim 1, wherein the first transistor comprises:
a first set of a first source/drain region and a second source/drain region;
a first semiconductor layer, disposed on and extending between the first set of the first source/drain region and the second source/drain region;
a first gate electrode, disposed on the first semiconductor layer, wherein the first semiconductor layer is between the first gate electrode and the first set of the first source/drain region and the second source/drain region; and
a first sensing layer, disposed at a first side of the through hole and overlapped with the first semiconductor layer and over the first gate electrode, and
the second transistor comprises:
a second set of a first source/drain region and a second source/drain region;
a second semiconductor layer, disposed on and extending between the second set of the first source/drain region and the second source/drain region;
a second gate electrode, disposed on the second semiconductor layer, wherein the second semiconductor layer is between the second gate electrode and the second set of the first source/drain region and the second source/drain region; and
a second sensing layer, disposed at a second side of the through hole and overlapped with the second semiconductor layer and over the second gate electrode,
wherein the first side of the through hole is opposite to the second side of the through hole in a direction perpendicular to a stacking direction of the substrate and the interconnect, and the first sensing layer and the second sensing layer are parts of the sensing film.

4. The semiconductor device of claim 3, wherein the first sensing layer and the second sensing layer are accessibly revealed by the through hole.

5. The semiconductor device of claim 3, wherein the first source/drain region and the second source/drain region included in the first set of the first source/drain region and the second source/drain region are disposed in different layers of the build-up layers of the interconnect, and wherein the first source/drain region and the second source/drain region included in the second set of the first source/drain region and the second source/drain region are disposed in different layers of the build-up layers of the interconnect.

6. The semiconductor device of claim 3, wherein the first gate electrode and the first semiconductor layer pass through one or more layers of the build-up layers of the interconnect, and wherein the second gate electrode and the second semiconductor layer pass through the one or more layers of the build-up layers of the interconnect.

7. The semiconductor device of claim 3, further comprises at least one additional first transistor or at least one additional second transistor and an additional through hole formed in the interconnect and laterally separated from the through hole, and
wherein the at least one additional first transistor or the at least one additional second transistor comprises:
a third set of a first source/drain region and a third source/drain region;
a third semiconductor layer, disposed on and extending between the third set of the first source/drain region and the second source/drain region;
a third gate electrode, disposed on the third semiconductor layer, wherein the third semiconductor layer is between the third gate electrode and the third set of the first source/drain region and the second source/drain region; and
a third sensing layer, disposed at a first side of the additional through hole and overlapped with the third semiconductor layer and over the third gate electrode, wherein the third sensing layer are a part of the sensing film, and wherein the additional through hole laterally disposed between the first transistor and the at least one additional first transistor or the at least one additional second transistor, and the first transistor further comprises an additional sensing layer disposed at a second side of the additional through hole and overlapped with the first semiconductor layer and over the first gate electrode, and wherein the first side of the additional through hole is opposite to the second side of the additional through hole in a direction perpendicular to a stacking direction of the substrate and the interconnect, or wherein the additional through hole disposed between the second transistor and the at least one additional first transistor or the at least one additional second transistor, and the second transistor further comprises an additional sensing layer disposed at a second side of the additional through hole and overlapped with the second semiconductor layer and over the second gate electrode, and wherein the first side of the additional through hole is opposite to the second side of the additional through hole in a direction perpendicular to a stacking direction of the substrate and the interconnect.

8. The semiconductor device of claim 7, wherein a structure of the first transistor and a structure of the second transistor are substantially identical to a structure of the at least one additional first transistor or the at least one additional second transistor.

9. The semiconductor device of claim 1, further comprising a cap disposed on the interconnect, wherein a cavity configurated to accommodate a fluid having a to-be-tested target is confined between the cap and the interconnect, and the first transistor and the second transistor are exposed to the cavity.

10. A semiconductor device, comprising:
a substrate, comprising a plurality of devices;
an interconnect, disposed on the substrate and electrically coupled to the plurality of devices, and having a first region and a second region surrounding the first region, wherein a first thickness of the first region is less than a second thickness of the second region; and
a sensor device, disposed on the substrate, the sensor device being in the interconnect and electrically coupled to the plurality of devices through the interconnect, and comprising:
a first sensing element, comprising:
a first sensing transistor, disposed in the second region and electrically coupled to the plurality of devices; and
a first sensing layer, disposed in the first region and laterally overlapped with the first sensing transistor; and
a first reference element, comprising:
a first reference transistor, disposed in the second region and electrically coupled to the plurality of devices; and
a second sensing layer, disposed in the first region and laterally overlapped with the first reference transistor,
wherein in a plane view of the semiconductor device, the first region is posited between and laterally separates the first sensing element and the first reference element, and the first sensing layer and the second sensing layer are disposed at opposite sides of the first region.

11. The semiconductor device of claim 10, wherein the interconnect comprises a first through hole formed in the first region, the first sensing layer vertically extends along a first sidewall of the first through hole so to laterally overlap with the first sensing transistor, the second sensing layer vertically extends along a second sidewall of the first through hole so to laterally overlap with the first reference transistor, and the first sidewall is opposite to the second sidewall.

12. The semiconductor device of claim 10, wherein the interconnect further has a third region, and the third region is surrounded by the second region and laterally separated from the first region by the second region, wherein a third thickness of the third region is substantially equal to the first thickness of the first region and is less than the second thickness of the second region,
wherein the sensor device further comprises:
a second reference element, comprising:
a second reference transistor, disposed in the second region and electrically coupled to the plurality of devices; and
a third sensing layer, disposed in the third region and laterally overlapped with the second reference transistor, wherein in the plane view of the semiconductor device, the third region is posited between and laterally separates the first sensing element and the second reference element, and the first sensing element is disposed between the first region and the third region,
wherein the first sensing element further comprises a fourth sensing layer disposed in the third region and laterally overlapped with the first sensing transistor, and the third sensing layer and the fourth sensing layer are disposed at opposite sides of the third region.

13. The semiconductor device of claim 12, wherein the interconnect comprises a second through hole formed in the third region, the third sensing layer vertically extends along a first sidewall of the second through hole so to laterally overlap with the second reference transistor, the fourth sensing layer vertically extends along a second sidewall of the second through hole so to laterally overlap with the first sensing transistor, and the first sidewall is opposite to the second sidewall.

14. The semiconductor device of claim 10, wherein the interconnect further has a third region, and the third region is surrounded by the second region and laterally separated from the first region by the second region, wherein a third thickness of the third region is substantially equal to the first thickness of the first region and is less than the second thickness of the second region,
wherein the sensor device further comprises:
a second sensing element, comprising:
a second sensing transistor, disposed in the second region and electrically coupled to the plurality of devices; and
a third sensing layer, disposed in the third region and laterally overlapped with the second sensing transistor, wherein in the plane view of the semiconductor device, the third region is posited between and laterally separates the first reference element and the second sensing element, and the first reference element is disposed between the first region and the third region, wherein the first reference element further comprises a fourth sensing layer disposed in the third region and laterally overlapped with the first reference transistor, and the third sensing layer and the fourth sensing layer are disposed at opposite sides of the third region.

15. The semiconductor device of claim 14, wherein the interconnect comprises a second through hole formed in the third region, the third sensing layer vertically extends along a first sidewall of the second through hole so to laterally overlap with the second sensing transistor, the fourth sensing layer vertically extends along a second sidewall of the second through hole so to laterally overlap with the first reference transistor, and the first sidewall is opposite to the second sidewall.

16. The semiconductor device of claim 10, further comprising:
  a cap, disposed on the interconnect, wherein a cavity is configured to accommodate a fluid having a to-be-tested target and is confined between the cap and the interconnect, and the sensor device are exposed to the cavity.

17. A method of manufacturing a semiconductor device, comprising:
  providing a substrate comprising devices therein;
  disposing an interconnect on the substrate, the interconnect being electrically coupled to the devices and comprising a plurality of build-up layers;
  forming a first transistor in the interconnect, the first transistor vertically extending through at least one of the plurality of build-up layers, and the first transistor being electrically coupled to a first device of the devices through the interconnect;
  forming a second transistor in the interconnect, the second transistor vertically extending through the at least one of the plurality of build-up layers, the second transistor being electrically coupled to a second device of the devices through the interconnect;
  patterning the interconnect to form a through hole, the first transistor and the second transistor being laterally separated from one another through the through hole; and
  disposing a sensing film on the interconnect, the sensing film further extending into the through hole, wherein the sensing film is laterally disposed between the first transistor and the second transistor.

18. The method of claim 17, prior to disposing the sensing film on the interconnect, further comprising:
  forming a third transistor in the interconnect, the third transistor vertically extending through the at least one of the plurality of build-up layers, the third transistor being electrically coupled to a third device of the devices through the interconnect; and
  patterning the interconnect to form another through hole, the second transistor and the third transistor being laterally separated from one another through another through hole,
  wherein the sensing film further extends into the another through hole, wherein the sensing film is laterally disposed between the second transistor and the third transistor.

19. The method of claim 17, prior to disposing the sensing film on the interconnect, further comprising:
  forming a dielectric layer over the interconnect, the first transistor and the second transistor being underneath the dielectric layer,
  wherein the dielectric layer is disposed between the sensing film and the first transistor and between the sensing film and the second transistor.

20. The semiconductor device of claim 17, further comprising:
  disposing a cap on the interconnect, the cavity being configured to accommodate a fluid having a to-be-tested target, wherein the cavity is confined between the cap and the interconnect, and the first transistor and the second transistor are exposed to the cavity.

* * * * *